United States Patent
Lee et al.

(10) Patent No.: US 10,950,813 B2
(45) Date of Patent: Mar. 16, 2021

(54) OPTICAL MODIFIER AND DISPLAY DEVICE INCLUDING THE SAME

(71) Applicant: Samsung Display Co., Ltd., Yongin-Si (KR)

(72) Inventors: Hongbeom Lee, Hwaseong-si (KR); Young-hoon Lee, Cheonan-si (KR); Taewoo Lim, Cheonan-si (KR); Hongkee Jung, Asan-si (KR); Dongwoo Kim, Seoul (KR); Wontae Kim, Suwon-si (KR); Cheonjae Maeng, Suwon-si (KR); Keunwoo Park, Incheon (KR); Seongyeon Lee, Asan-si (KR); Minsu Kim, Hwaseong-si (KR); Dongil Son, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/565,137

(22) Filed: Sep. 9, 2019

(65) Prior Publication Data
US 2020/0136074 A1    Apr. 30, 2020

(30) Foreign Application Priority Data
Oct. 29, 2018    (KR) .................. 10-2018-0129807

(51) Int. Cl.
*H01L 51/00*    (2006.01)
*H01L 51/50*    (2006.01)
*H01L 51/52*    (2006.01)
*H01L 27/32*    (2006.01)

(52) U.S. Cl.
CPC ........ *H01L 51/502* (2013.01); *H01L 27/3232* (2013.01); *H01L 51/0094* (2013.01); *H01L 51/5036* (2013.01); *H01L 51/5096* (2013.01); *H01L 51/5237* (2013.01); *H01L 2251/558* (2013.01)

(58) Field of Classification Search
CPC ......... H01L 2251/5369; H01L 51/5268; H01L 27/3206; H01L 2933/0041; H01L 2933/0058; H01L 33/60
See application file for complete search history.

(56) References Cited

U.S. PATENT DOCUMENTS

| | | | |
|---|---|---|---|
| 9,958,727 B2 | 5/2018 | Oba et al. | |
| 10,359,672 B2* | 7/2019 | Kwon | G02F 1/133514 |
| 2008/0001538 A1* | 1/2008 | Cok | B82Y 20/00 313/506 |
| 2008/0084150 A1* | 4/2008 | Cok | B82Y 20/00 313/110 |
| 2008/0297029 A1* | 12/2008 | Cok | B82Y 20/00 313/498 |

(Continued)

FOREIGN PATENT DOCUMENTS

| | | |
|---|---|---|
| KR | 10-2017-0074908 A | 6/2017 |
| KR | 10-1858502 B1 | 6/2017 |

*Primary Examiner* — Jaehwan Oh
(74) *Attorney, Agent, or Firm* — Innovation Counsel LLP

(57) ABSTRACT

An optical modifier may include a color controller including quantum dots, a barrier layer encapsulating the color controller, and a low refractive layer spaced apart from the color controller with the barrier layer interposed between the color controller and the barrier layer. The barrier layer may have a layer density ranging from 1.50 g/cm3 to 3.0 g/cm3.

29 Claims, 12 Drawing Sheets

(56) References Cited

U.S. PATENT DOCUMENTS

| | | |
|---|---|---|
| 2017/0248748 A1* | 8/2017 | Satake ................. G02B 6/0055 |
| 2017/0269435 A1* | 9/2017 | Yoon .................. G02F 1/133617 |
| 2018/0088369 A1* | 3/2018 | Kim ..................... G02F 1/1336 |
| 2018/0107028 A1* | 4/2018 | Jung ................. G02F 1/133502 |
| 2018/0175315 A1* | 6/2018 | Kon .......................... B32B 9/00 |
| 2018/0218703 A1 | 8/2018 | Lee et al. |

* cited by examiner

OPTICAL MODIFIER AND DISPLAY DEVICE INCLUDING THE SAME

CROSS-REFERENCE TO RELATED APPLICATIONS

This U.S. non-provisional patent application claims priority under 35 U.S.C. § 119 to Korean Patent Application No. 10-2018-0129807, filed on Oct. 29, 2018, in the Korean Intellectual Property Office, the entire contents of which are hereby incorporated by reference.

BACKGROUND OF THE INVENTION

The present disclosure relates to a display device, and in particular, to a highly reliable optical modifier and a display device including the same.

In multimedia devices such as televisions, mobile phones, tablet computers, navigation systems, gaming machines, and the like, various display devices are being developed as a means for providing image information. In particular, quantum dots are being introduced to improve a display quality of a display device including liquid crystal display elements or organic electroluminescence display elements.

To improve optical efficiency of such a quantum-dot display device, a material of low refractive index is used for an optical modifier. However, to increase reliability of a display device, it is necessary to develop an optical modifier with a low refractive index property and improved durability.

SUMMARY

According to an embodiment of the inventive concept, it may be possible to improve a delamination issue in an optical modifier. This may make it possible to realize a highly-reliable display device.

According to an embodiment of the inventive concept, an optical modifier may include a color controller including quantum dots, a barrier layer encapsulating the color controller, and a low refractive layer spaced apart from the color controller with the barrier layer interposed between the color controller and the barrier layer. The barrier layer may have a layer density ranging from 1.50 g/cm3 to 3.0 g/cm3.

In an embodiment, the barrier layer may include silicon nitride ($SiN_x$).

In an embodiment, a content ratio of nitrogen (N) to silicon (Si) in the barrier layer may range from about 0.70 to 1.50.

In an embodiment, a remaining stress of the barrier layer may range from −300 MPa to 500 MPa.

In an embodiment, the barrier layer may include silicon oxide ($SiO_x$).

In an embodiment, a remaining stress of the barrier layer may range from −500 MPa to 500 MPa.

In an embodiment, the barrier layer may include a first inorganic layer covering a rear surface of the color controller and a second inorganic layer covering a top surface of the color controller.

In an embodiment, each of the first and second inorganic layers may be composed of a single layer.

In an embodiment, the barrier layer may include silicon nitride ($SiN_x$), a thickness of the first inorganic layer may be larger than or equal to 0.1 μm, and a thickness of the second inorganic layer may be larger than or equal to 0.3 μm.

In an embodiment, the barrier layer may include silicon oxide ($SiO_x$), a thickness of the first inorganic layer may be larger than or equal to 0.3 μm, and a thickness of the second inorganic layer may be larger than or equal to 0.3 μm.

In an embodiment, at least one of the first and second inorganic layers may include a first layer containing silicon nitride ($SiN_x$) and a second layer, which is stacked on the first layer and contains silicon oxide ($SiO_x$).

In an embodiment, each of the first layer and the second layer may be provided in plural, and the first and second layers may be disposed in an alternate manner.

According to an embodiment of the inventive concept, a display device may include a base substrate, a plurality of pixels disposed on the base substrate, a color controller disposed on or below the pixels, the color controller including quantum dots, a barrier layer encapsulating the color controller, and a low refractive layer spaced apart from the color controller with the barrier layer interposed between the color controller and the barrier layer. The barrier layer may have a layer density ranging from 1.50 g/cm3 to 3.0 g/cm3.

In an embodiment, the barrier layer may include a first inorganic layer covering a rear surface of the color controller and a second inorganic layer covering a top surface of the color controller.

In an embodiment, the barrier layer may include silicon nitride ($SiN_x$), and a content ratio of nitrogen (N) to silicon (Si) in the barrier layer may range from 0.70 to 1.50.

In an embodiment, a thickness of the first inorganic layer may be larger than or equal to 0.1 μm, and a thickness of the second inorganic layer may be larger than or equal to 0.3 μm.

In an embodiment, the barrier layer may include silicon oxide ($SiO_x$), a thickness of the first inorganic layer may be larger than or equal to 0.3 μm, and a thickness of the second inorganic layer may be larger than or equal to 0.3 μm.

In an embodiment, each of the pixels may include a transistor disposed on the base substrate, a first electrode connected to the transistor, a second electrode facing the first electrode, and a liquid crystal layer disposed between the first electrode and the second electrode.

In an embodiment, the display device may further include a light source disposed below the base substrate to provide light, and a light guide plate including an emission surface facing the base substrate, a bottom surface opposite to the emission surface, an incidence surface facing the light source and connecting the bottom surface to the emission surface, and an opposite surface opposite to the incidence surface. The light may be a blue light.

In an embodiment, the display device may further include a first polarization layer and a second polarization layer, which are spaced apart from each other with the pixel interposed therebetween.

In an embodiment, the color controller may include sub-color controllers, each of which converts the light to light of different color.

In an embodiment, the display device may further include a light-blocking portion including a plurality of openings and a light filter layer overlapped with at least one of the openings. At least one of the sub-color controllers may be disposed to be overlapped with the light filter layer.

In an embodiment, each of the pixels may include a transistor provided on the base substrate and an organic light emitting device. The organic light emitting device may include a first electrode connected to the transistor, a second electrode spaced apart from the first electrode, and an organic layer disposed between the first electrode and the second electrode.

In an embodiment, the color controller may include sub-color controllers converting light, which is provided from the pixels, to light of different color.

In an embodiment, the organic layer may be disposed on an entire surface of the base substrate to provide a blue light to the color controller.

In an embodiment, the organic layer may include a plurality of patterns providing lights of different colors, and each of the patterns may be overlapped with a corresponding one of the sub-color controllers.

BRIEF DESCRIPTION OF THE DRAWINGS

Example embodiments will be more clearly understood from the following brief description taken in conjunction with the accompanying drawings. The accompanying drawings are presented for purposes of illustration and not of limitation.

Figure 1:
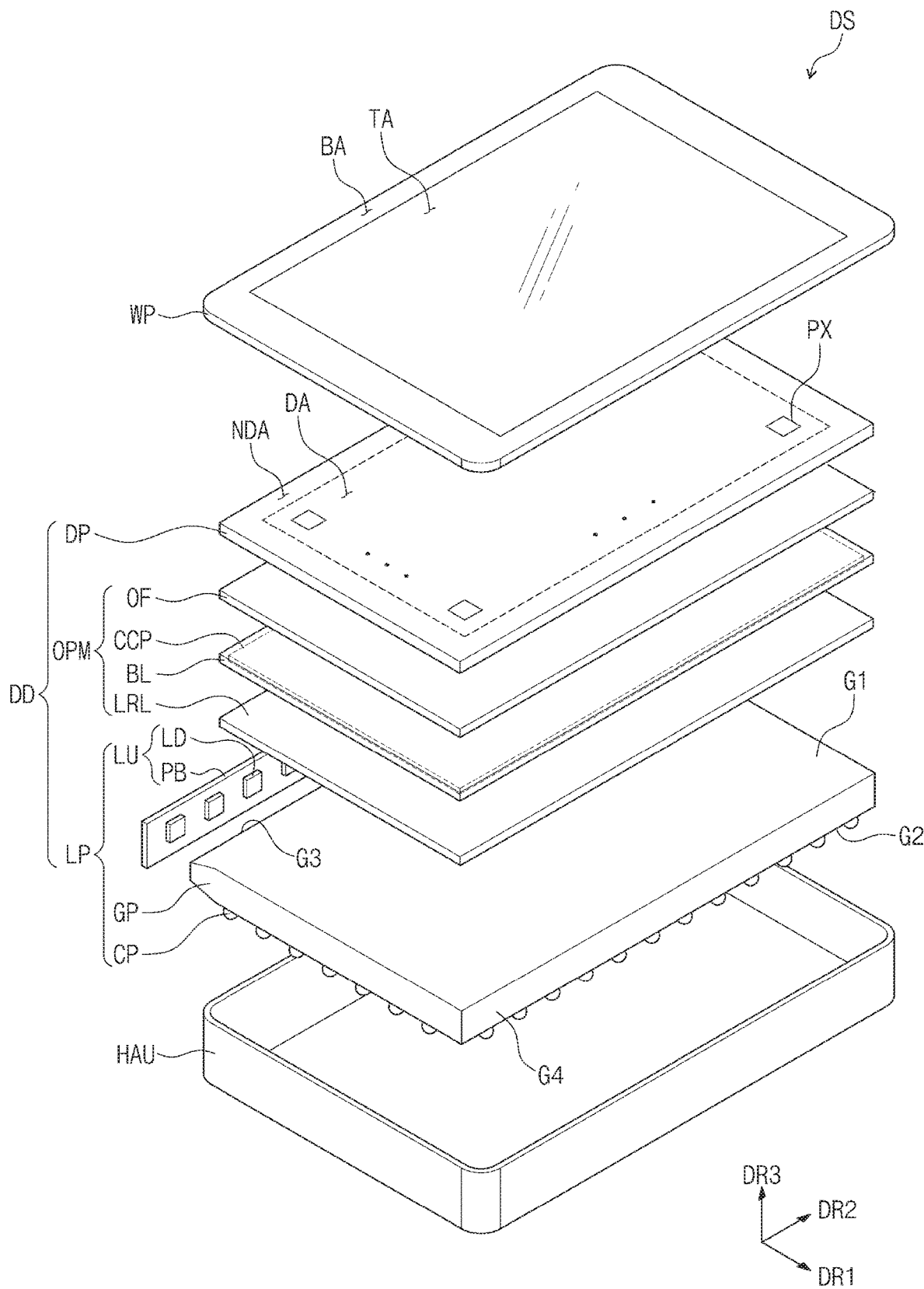
FIG. 1 is an exploded perspective view illustrating a display device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
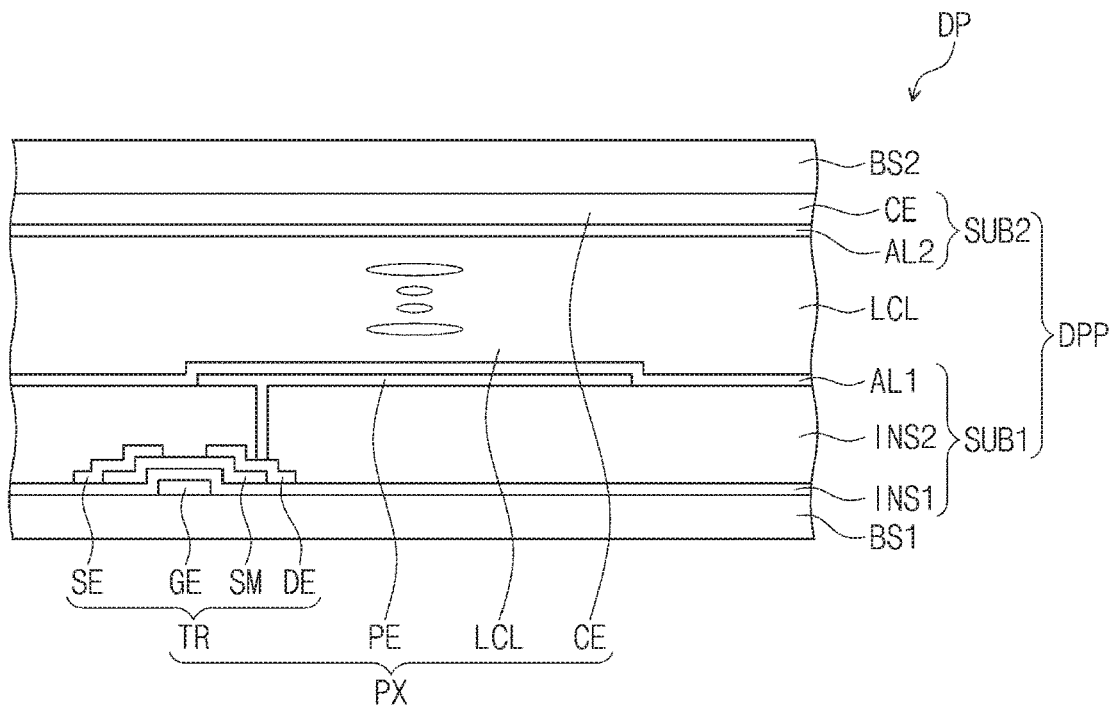
FIG. 2 is a sectional view illustrating some elements of a display module according to an embodiment of the inventive concept.
Figure 3:
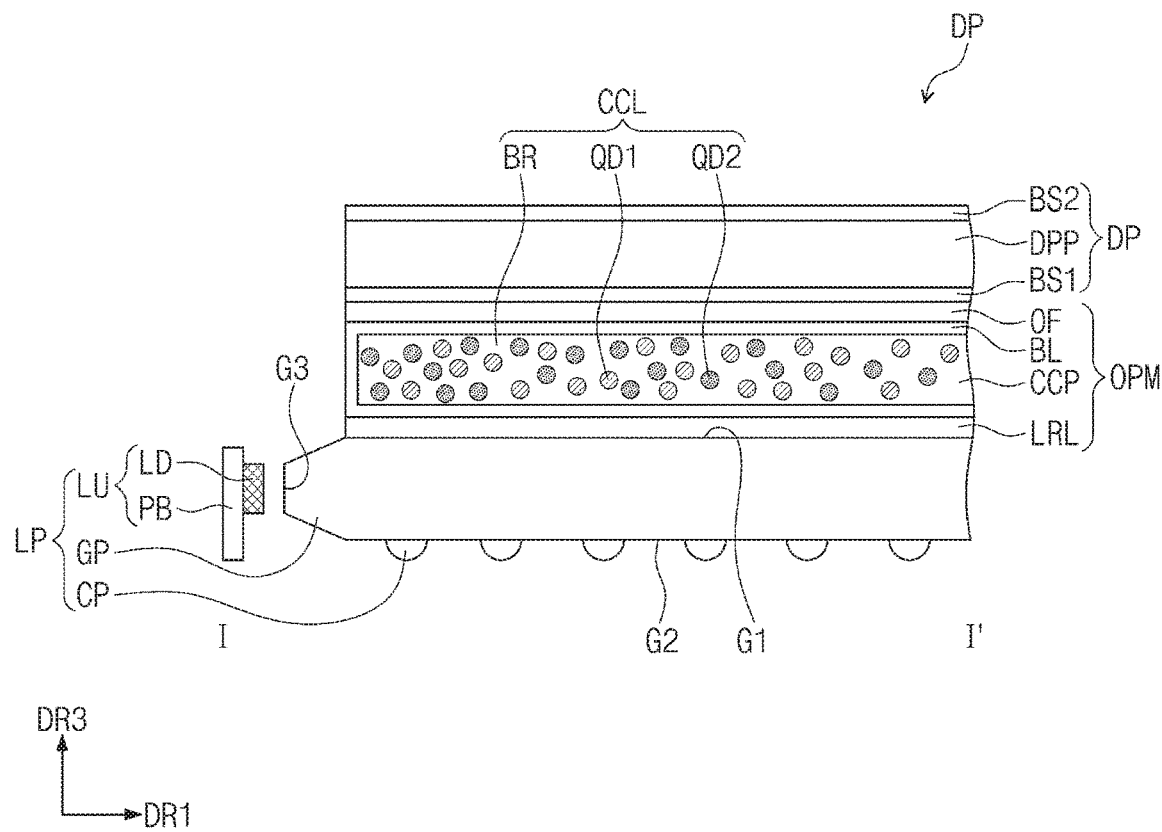
FIG. 3 is a sectional view illustrating a display according to an embodiment of the inventive concept.

FIG. 1 is an exploded perspective view illustrating a display device according to an embodiment of the inventive concept. FIG. 2 is a sectional view illustrating some elements of a display module according to an embodiment of the inventive concept. FIG. 3 is a sectional view illustrating a display according to an embodiment of the inventive concept. Hereinafter, a display device DS according to an embodiment of the inventive concept will be described with reference to FIGS. 1 to 3.

Referring to FIGS. 1 and 2, the display device DS according to an embodiment of the inventive concept may include a window WP, a display module DD, and a housing HAU. In an embodiment, the display device DS may include a display element which is used to display an image. For example, the display device DS may be a liquid crystal display device or an organic electroluminescence display device.

Meanwhile, a first axis direction DR1, a second axis direction DR2, and a third axis direction DR3 are illustrated in the drawings, but the axes direction may be just relative concept. For convenience in description, the direction of the third axis direction DR3 may be defined as a propagation direction of the image light toward a user. In addition, the first axis direction DR1 (hereinafter, a first direction) and the second axis direction DR2 (hereinafter, a second direction) may be perpendicular to each other, and the third axis direction DR3 (hereinafter, a third direction) may be a direction normal to a plane defined by the first and second directions DR1 and DR2. In FIG. 1, the plane defined by the first and second directions DR1 and DR2 may be a display surface, on which an image is displayed.

The window WP may be disposed on the display module DD. The window WP may be formed of or include at least one of glass, sapphire, or plastic materials. The window WP may include a transmission region TA which allows an image light provided from the display module DD to pass therethrough, and a light-blocking region BA which is adjacent to the transmission region TA and prevents the image light from passing therethrough. The transmission region TA may be disposed at a center region of the display device DS when viewed in a plan view parallel to the first and second directions DR1 and DR2. The light-blocking region BA may be disposed to surround the transmission region TA and may have a frame shape enclosing the transmission region TA. However, the inventive concept is not limited to this example, and in an embodiment, the window WP may not have the light-blocking region BA. In addition, the light-blocking region BA may be partially disposed in at least one of edge or side regions of the transmission region TA. In an embodiment, the window WP may be omitted from the display device DS, unlike that shown in FIG. 1.

In an embodiment, the display module DD may include a display panel DP, an optical modifier OPM, and a backlight LP.

In an embodiment, the display panel DP may be disposed between the window WP and the housing HAU. The display panel DP may include a liquid crystal display element or an organic electroluminescence display element. The description that follows will be described with respect to an example in which the display panel DP includes liquid crystal display elements.

In an embodiment, the display panel DP may include a first base substrate BS1, a display portion DPP, and a second base substrate BS2. The display portion DPP may include a first display layer SUB1, a liquid crystal layer LCL, a second display layer SUB2. The first display substrate SUB1, the liquid crystal layer LCL, and the second display substrate SUB2 may be disposed between the first base substrate BS1 and the second base substrate BS2.

The first base substrate BS1 may be provided as a base layer on which elements of the display portion DPP are deposited. Each of the first base substrate BS1 and the second base substrate BS2 may be a transparent insulating substrate. For example, each of the first base substrate BS1 and the second base substrate BS2 may be a glass substrate, a plastic substrate, or the like. In an embodiment, each of the first base substrate BS1 and the second base substrate BS2 may be a metal substrate, but the inventive concept is not limited to the above examples or a specific embodiment. The first base substrate BS1 and the second base substrate BS2 may be disposed to face each other.

The display portion DPP may include pixels PX which are used to display an image. The pixels PX may be arranged in a matrix configuration. The display portion DPP of the display panel DP may include a display region DA on which the pixels PX are disposed, and a non-display region NDA which is adjacent to the display region DA.

In an embodiment, the display region DA may be overlapped with the transmission region TA of the window WP. The non-display region NDA may be overlapped with the light-blocking region BA of the window WP, but in an embodiment, the non-display region NDA may be omitted. In addition, the display region DA may be partially disposed in at least one of edge or side regions of the non-display region NDA.

In an embodiment, the first display substrate SUB1 may have a transistor TR, insulating layers INS1 and INS2, a pixel electrode PE, and a first alignment layer AL1. The second display substrate SUB2 may have a second alignment layer AL2 and a common electrode CE.

The pixels PX may be disposed between the first base substrate BS1 and the second base substrate BS2. Each of the pixels PX may include the transistor TR and the liquid crystal capacitor which includes a pixel electrode PE connected to the transistor TR, a liquid crystal layer LCL, and a common electrode CE facing the pixel electrode PE. The transistor TR may include a control electrode GE, an input electrode SE, an output electrode DE, and a semiconductor pattern SM. A dielectric layer disposed between the pixel electrode PE and the common electrode CE may be the liquid crystal layer LCL.

Each of the pixels PX may be connected to a corresponding signal lines of a plurality of signal lines (not shown). The signal lines may include a plurality of gate lines and a plurality of data lines. The gate lines may be arranged in one direction of the display panel DP. The data lines may be disposed to cross the gate lines.

The control electrode GE may be disposed on the first base substrate BS1. The control electrode GE may be connected to a corresponding one of the gate lines. The control electrode GE may be formed of or include a conductive material. For example, the control electrode GE may be formed of or include at least one of metallic materials, such as nickel (Ni), molybdenum (Mo), aluminum (Al), titanium (Ti), copper (Cu), and tungsten (W), or metal oxide materials. The control electrode GE may have a single- or a multi-layered structure. The gate line may be formed of the same material as the control electrode GE and may have the same structure as the control electrode GE.

A first insulating layer INS1 may cover the control electrode GE and the first base substrate BS1. The first insulating layer INS1 may include an inorganic material. For example, the first insulating layer INS1 may be formed of or include at least one of silicon oxide (SiOx), silicon nitride (SiNx), or silicon oxynitride (SiON).

The semiconductor pattern SM may be disposed on the first insulating layer INS1. At least a portion of the semiconductor pattern SM may be overlapped with the control electrode GE.

Although a bottom gate type transistor is illustrated in FIG. 2, the inventive concept is not limited to this example. For example, the inventive concept may be applied to a top gate type transistor in which a control electrode is disposed on an input or output electrode.

The input electrode SE and the output electrode DE may be disposed on the first insulating layer INS1. A portion of the input electrode SE may be connected to a corresponding one of the data lines and an opposite portion of the input electrode SE may be overlapped with the semiconductor pattern SM. A portion of the output electrode DE may be overlapped with the semiconductor pattern SM, and an opposite portion of the output electrode DE may be connected to the pixel electrode PE. The opposite portion of the input electrode SE may be spaced apart from the portion of the output electrode DE.

Each of the input and output electrodes SE and DE may be formed of or include a conductive material. For example, each of the input and output electrodes SE and DE may be formed of or include at least one of nickel (Ni), chromium (Cr), molybdenum (Mo), aluminum (Al), titanium (Ti), copper (Cu), tungsten (W), or alloys thereof. Each of the input and output electrodes SE and DE may have a single- or a multi-layered structure. The data line may be formed of the same material as the input electrode SE and may have the same structure as the input electrode SE.

A second insulating layer INS2 may be disposed on the first insulating layer INS1. The second insulating layer INS2 may cover the transistor TR. The second insulating layer INS2 may include an organic layer and/or an inorganic layer. The second insulating layer INS2 may have a single- or a multi-layered structure. For example, the second insulating layer INS2 may include an inorganic layer which is disposed on the transistor TR and an organic layer which is disposed on the inorganic layer and provides a flat top surface.

The pixel electrode PE may be disposed on the second insulating layer INS2. The pixel electrode PE may be electrically connected to the output electrode DE through a contact hole which is formed to penetrate the second insulating layer INS2. The pixel electrode PE may include a transparent conductive material. The pixel electrode PE may be formed of or include at least one of, for example, indium tin oxide, indium zinc oxide, indium gallium zinc oxide, fluorine zinc oxide, gallium zinc oxide, or tin oxide. Since the pixel electrode PE is electrically connected to the output electrode DE through the contact hole defined in the second insulating layer INS2, the pixel electrode PE may receive a voltage corresponding to a data signal through the output electrode DE.

The liquid crystal layer LCL may include liquid crystal molecules exhibiting an anisotropic property. The liquid crystal molecules may be variously arranged depending on an electric field that is applied between the common electrode CE and the pixel electrode PE. The arrangement of the liquid crystal molecules may be changed to control an amount of light passing through the liquid crystal layer LCL.

In an embodiment, the display panel DP may include a first alignment layer AL1 and a second alignment layer AL2. The first alignment layer AL1 may be disposed between the pixel electrode PE and the liquid crystal layer LCL, and the second alignment layer AL2 may be disposed between the liquid crystal layer LCL and the common electrode CE to align the liquid crystal molecules of the liquid crystal layer LCL. The first alignment layer AL1 and the second alignment layer AL2 may be formed of a vertical alignment layer and may include polyamic acid, poly siloxane, poly imide, and so forth.

The common electrode CE may be disposed on the second alignment layer AL2. As described above, the common electrode CE, along with the pixel electrode PE, may constitute a liquid crystal capacitor. The common electrode CE may be formed of or include a transparent conductive material. For example, the common electrode CE may be formed of or include at least one of indium tin oxide, indium zinc oxide, indium gallium zinc oxide, fluorine zinc oxide, gallium zinc oxide, or tin oxide.

In an embodiment, the optical modifier OPM may include an optical sheet OF, a color controller CCP, a barrier layer BL, and a low refractive layer LRL.

The optical sheet OF may be disposed below the display panel DP. The optical sheet OF may include at least one of a diffusion sheet, a prism sheet, or a brightness enhancement sheet. The diffusion sheet may be disposed adjacent to the backlight LP. The diffusion sheet may disperse light, which is incident from a light guide plate GP, to prevent the light to be concentrated in a localized region. The diffusion sheet may be formed of or include at least one of, for example, polyester or polycarbonate. When light is incident onto the prism sheet from the diffusion sheet, the prism sheet may alter a direction of the incident light toward a direction perpendicular to a display surface and may concentrate a radial light to improve brightness. The brightness enhancement sheet (e.g., dual brightness enhance film) may reduce optical loss of light which has passed through the prism sheet. In an embodiment, the optical sheet OF may be omitted from the optical modifier OPM.

Referring to FIG. 3, the color controller CCP according to an embodiment of the inventive concept may be disposed between the display panel DP and the backlight LP.

The color controller CCP may include a plurality of converters which convert a color of light which is incident from the light guide plate GP. Each of the converters may absorb at least a portion of an incident light and then emit light whose color is changed from that of the incident light, or may transmit a portion of the incident light without a change in color.

In the case where the energy of the light incident onto the color controller CCP is high enough to excite the conversion particle, the conversion particle may absorb at least a portion of the incident light, thereby being in an excited state, and then, when it is returned to a stable or low-energy state, light, whose color is different from that of the incident light, may be emitted from the conversion particle. By contrast, in the case where the energy of the incident light is too low to excite the conversion particle, the incident light may pass through the color controller CCP without a change in color and then may be provided to an external user.

The color controller CCP may include a first converter QD1, a second converter QD2, and a base resin BR.

The base resin BR may be a medium material, in which the first and second converters QD1 and QD2 are dispersed, and, in general, the base resin BR may be called "binder". If the first and second converters QD1 and QD2 can be dispersed in a medium material, such a medium material may be referred to as the base resin BR, regardless of its name, additional function, or constituents. The base resin BR may be a polymer resin. For example, the base resin BR may be formed of or include various resin compounds, such as acrylic resins, urethane resins, and/or epoxy resins.

Light emitted from the converters of the color controller CCP may be radiated in various directions. To generate a white light, the converters QD1 and QD2 of the color controller CCP may have different sizes, depending on optical characteristics (e.g., wavelength or energy) of light provided from a light source LU. In an embodiment, the converters QD1 and QD2 may be quantum dots.

For example, the converters QD1 and QD2 may be selected from the group consisting of II-VI compounds, III-V compounds, IV-VI compounds, IV elements, IV compounds, and combination thereof. The II-VI compounds may be selected from the group consisting of binary compounds (e.g., including CdSe, CdTe, ZnS, ZnSe, ZnTe, ZnO, HgS, HgSe, HgTe, MgSe, and MgS), mixtures of the binary compounds, ternary compounds (e.g., including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The III-V compounds may be selected from the group consisting of binary compounds (e.g., including GaN, GaP, GaAs, GaSb, AN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InNP, InNAs, InNSb, InPAs, InPSb, and GaAlNP), mixtures of the ternary compounds, quaternary compounds (e.g., including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds.

The IV-VI compounds may be selected from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPbSTe), and mixtures of the quaternary compounds.

The IV elements may be selected from the group consisting of Si, Ge, and mixtures thereof. The IV compounds may include binary compounds selected from the group consisting of SiC, SiGe, and mixtures thereof. The shapes of the converters QD1 and QD2 may be variously changed, and the inventive concept is not limited to specific shapes of the converters QD1 and QD2. For example, the converters QD1 and QD2 may be spherical, pyramid-shaped, multi-arm, or cubic nano particles. Alternatively, a nano tube, a nano wire, a nano fiber, or a nano plate-shaped particle may also be used for each of the converters QD1 and QD2.

However, the inventive concept is not limited to this example, and in an embodiment, the color controller CCP may include a plurality of fluorescent bodies. For example, in the case where the backlight LP provides a blue light, the color controller CCP may include a plurality of fluorescent bodies which absorb the blue light and emits a red light. The fluorescent bodies for the red light may be formed of or include at least one of, for example, sulfur (S), 2Si5N8, CaAlSiN3, CaMoO4, or Eu2Si5N8.

The color controller CCP may include fluorescent bodies, which absorb a blue light provided from the backlight LP and emit a green light. The fluorescent bodies for the green light may be formed of or include at least one of, for example, yttrium aluminum garnet (YAG), (Ca, Sr, Ba)2SiO4, SrGa2S4, BAM, α-SiAlON, β-SiAlON), Ca3Sc2Si3O12, Tb3Al5O12, BaSiO4, CaAlSiON, or (Sr1-xBax)Si2O2N2.

In an embodiment, the converters QD1 and QD2 may absorb a blue light and then may convert the blue light to green light or red light. However, a fraction of the blue light may not be absorbed by the converters QD1 and QD2. This means that blue light, green light and red light are mixed in the color controller CCP to form a white light.

The barrier layer BL may cover the color controller CCP. The barrier layer BL may encapsulate or seal the color controller CCP completely, thereby preventing a side surface of the color controller CCP from being exposed to the outside. Thus, the barrier layer BL may prevent external moisture and/or oxygen from entering the color controller CCP.

The barrier layer BL may include at least one inorganic layer. In other words, the barrier layer BL may be formed of or include an inorganic material. For example, the barrier layer BL may be formed of or include at least one of silicon nitride ($SiN_x$), aluminum nitride ($AlN_x$), zirconium nitride (ZrNX), titanium nitride (TiNX), hafnium nitride ($HfN_x$), silicon oxide ($SiO_x$), aluminum oxide ($AlO_x$), titanium oxide ($TiO_x$), or silicon oxynitride ($SiO_xN_y$).

In an embodiment, the barrier layer BL may be formed of or include a metal thin film having a sufficiently high optical transmittance. Alternatively, the barrier layer BL may include an organic layer. For example, the barrier layer BL may include at least one of polyimide, polyethylene terephthalate, polycarbonate, epoxy, polyethylene, or polyacrylate. The barrier layer BL may be composed of a single layer or a plurality of layers.

The description that follows will refer to an example in which the barrier layer BL includes silicon nitride ($SiN_x$) and/or silicon oxide ($SiO_x$).

The low refractive layer LRL may be disposed between the light guide plate GP and the color controller CCP. The low refractive layer LRL may have a refractive index that is lower than a refractive index of the light guide plate GP. In the case where the light guide plate GP and the color controller CCP disposed thereon have a similar refractive index, light may not be totally reflected at an interface between the light guide plate GP and the color controller CCP. In this case, light incident into the light guide plate GP may not be properly guided within the light guide plate GP toward the color controller CCP and may be partially emitted to the outside. In certain cases, this may lead to localized emission of light through a specific region (i.e., a hot spot phenomenon).

According to an embodiment of the inventive concept, the low refractive layer LRL, which has a refractive index lower than that of the light guide plate GP, may be disposed between the light guide plate GP and the color controller CCP to prevent the hot spot phenomenon. Furthermore, it may be possible to increase a minimum angle for the total reflection at an interface between the light guide plate GP and the low refractive layer LRL and thereby to improve the total reflection efficiency in the light guide plate GP.

The backlight LP may be disposed below the display panel DP to provide light to the display panel DP. In an embodiment, the backlight LP may include a light source LU and a light emitting pattern CP in addition to the light guide plate GP.

The light source LU may include a circuit substrate PB and a light source LD. The circuit substrate PB may be electrically connected to the light source LD to control a light emission operation of the light source LD. As shown in FIG. 1, a plurality of the light sources LD may be provided on the circuit substrate PB. In an embodiment, the light source LU may be disposed to face a side surface of the light guide plate GP to form an edge type light source LU.

In an embodiment, the circuit substrate PB may include a plurality of circuit substrates, which are disposed to correspond to a plurality of the light sources. Although not shown, the circuit substrate PB may include a substrate and a circuit layer. The circuit layer may be electrically connected to the light source LD. In detail, the circuit layer may be connected to electrodes (not shown) of the light source LD. The circuit layer may include conductive lines or conductive pads which are connected to the electrodes, respectively. The circuit layer may be formed of or include a metal material (e.g., copper).

The light source LD may be electrically connected to the circuit layer. The light source LD may include a light emitting diode (LED) which generates light in response to an electrical signal received from the circuit layer. The light emitting diode may include a first electrode, an n-type semiconductor layer, an active layer, a p-type semiconductor layer, and a second electrode, which are sequentially stacked, and here, the first electrode and the second electrode may be electrically connected to the circuit layer. If a driving voltage is applied to the light emitting diode, electrons and holes may be combined to produce a photon. In an embodiment, the light source LD may include a plurality of light emitting diodes which are configured to produce photons of the same color or different colors but the inventive concept is not limited to this example. In an embodiment, the light source LD may be configured to produce a blue light.

The light guide plate GP may be disposed below the display panel DP. The light guide plate GP may guide light which is received from the light source LU toward the display panel DP. The light guide plate GP may be formed of or include a material having high transmittance to a visible light. In an embodiment, the light guide plate GP may be formed of an optically transparent material. For example, the light guide plate GP may include a glass substrate, a plastic substrate, or a combination thereof. For the sake of simplicity, the description that follows will refer to an example in which the light guide plate GP is formed of glass.

The light guide plate GP may include an emission surface G1, a bottom surface G2, a plurality of side surfaces G3 and G4. The emission surface G1 may be a surface facing the display panel DP. The bottom surface G2 may be opposite to the emission surface G1. As shown in FIG. 1, the side surfaces G3 and G4 may include first and second side surfaces G3 and G4, which face each other in the first direction DR1, and third and fourth side surfaces, which face each other in the second direction DR2 and are connected to the first and second side surfaces G3 and G4.

In an embodiment, one of the side surfaces G3 and G4 may be used as a light incidence surface, which faces the light source LD and receives light provided from the light source LD. In an embodiment, the first side surface G3 may be the light incidence surface. The light guide plate GP may guide light incident onto the incidence surface G3 toward the display panel DP through the emission surface G1. However, the inventive concept is not limited to this example or a specific embodiment, and in an embodiment, one of the second to fourth side surfaces may be defined as the incidence surface or two or more side surfaces may be defined as the incidence surface.

The light emitting pattern CP may be formed of a material whose refractive index is different from that of the light guide plate GP. The light emitting pattern CP may be configured to transfer light which is emitted from the light source LU and is incident onto a side surface of the light guide plate GP to another side surface of the light guide plate GP. Alternatively, the light emitting pattern CP may be configured to change a propagation direction of light which is incident through the bottom surface G2 of the light guide plate GP toward the top surface of the light guide plate GP or toward the emission surface G1.

Referring back to FIG. 1, the housing HAU may be disposed below the display panel DP to accommodate the display panel DP. The housing HAU may cover the display panel DP and may expose the display surface (e.g., the top surface) of the display panel DP. For example, the housing HAU may cover side and bottom surfaces of the display panel DP and may expose the entire top surface of the display panel DP. In an embodiment, the housing HAU may cover not only the side and bottom surfaces of the display panel DP but also a portion of the top surface of the display panel DP, but the inventive concept is not limited to this example or a specific embodiment.

In an embodiment, the barrier layer BL may be formed of or include at least one of silicon nitride ($SiN_x$) or silicon oxide ($SiO_x$). A density of the barrier layer BL containing silicon nitride ($SiN_x$) may range from 1.50 g/cm3 to 3.0 g/cm3. In the barrier layer BL containing silicon nitride ($SiN_x$), a content ratio of nitrogen (N) to silicon (Si) may range from 0.70 to 1.50.

In an embodiment, a remaining stress of the barrier layer BL containing silicon nitride ($SiN_x$) may range from −300 MPa to 500 MPa. In an embodiment, the remaining stress may be a compressive stress.

In the barrier layer BL containing silicon nitride ($SiN_x$), if the layer density and the content ratio of nitrogen (N) to silicon (Si) are less than 1.50 g/cm3 and less than 0.70, respectively, a moisture vapor transmission rate (MVTR) of the barrier layer BL may be deteriorated to cause a reduction in life span of the color controller CCP. In addition, due to a surface oxidation of the barrier layer BL, a delamination issue may occur between the barrier layer BL and layers adjacent thereto.

In the barrier layer BL containing silicon nitride ($SiN_x$), the layer density and the content ratio of nitrogen (N) to silicon (Si) are higher than 3.0 g/cm3 and higher than 1.50, respectively, a process cost may be increased due to the increase in layer density of the barrier layer BL.

In an embodiment, the barrier layer BL may be formed of or include silicon oxide ($SiO_x$). The barrier layer BL containing silicon oxide ($SiO_x$) may have a density ranging from 1.50 g/cm3 to 3.0 g/cm3.

A remaining stress of the barrier layer BL containing silicon oxide ($SiO_x$) may range from −500 MPa to 500 MPa. In an embodiment, the remaining stress may be a compressive stress.

In the case where the layer density of the barrier layer BL containing silicon oxide ($SiO_x$) is less than 1.50 g/cm3, a moisture vapor transmission rate (MVTR) of the barrier layer BL may be deteriorated to cause a reduction in life span of the color controller CCP. In addition, due to a surface oxidation of the barrier layer BL, a delamination issue may occur between the barrier layer BL and layers adjacent thereto.

In the case where the layer density of the barrier layer BL containing silicon oxide ($SiO_x$) is higher than 3.0 g/cm3, a process cost may be increased due to the increase in layer density of the barrier layer BL.

Figure 4A:
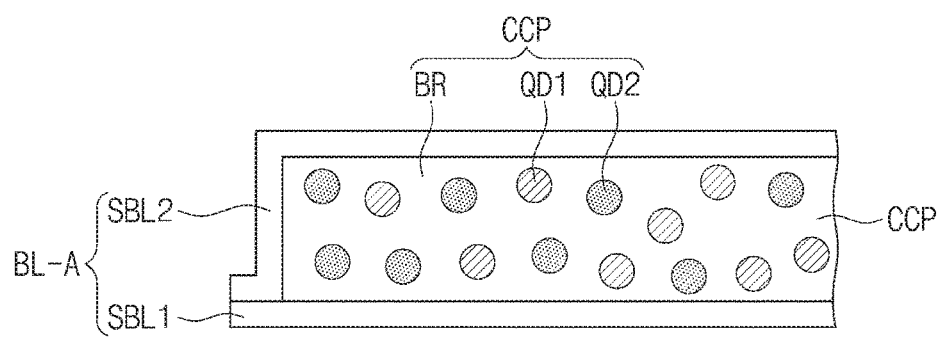
FIGS. 4A and 4B are enlarged views illustrating some elements of an optical modifier according to an embodiment of the inventive concept.
Figure 4B:
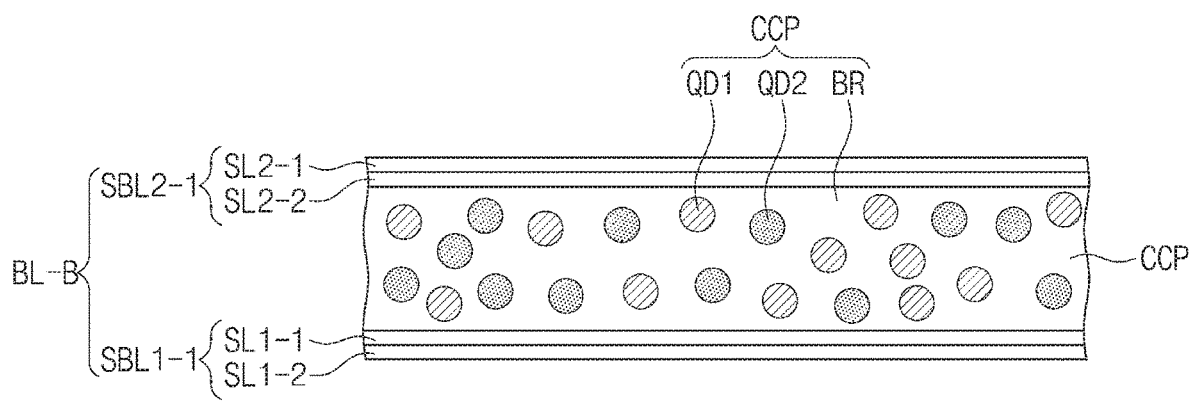

FIGS. 4A and 4B are enlarged views illustrating some elements of an optical modifier according to an embodiment of the inventive concept. For concise description, an element previously described with reference to FIGS. 1 to 3 may be identified by a similar or identical reference number without repeating an overlapping description thereof.

Referring to FIG. 4A, a barrier layer BL-A according to an embodiment of the inventive concept may include a first inorganic layer SBL1 and a second inorganic layer SBL2. The first inorganic layer SBL1 may be disposed between the low refractive layer LRL shown in FIG. 3 and the color controller CCP to be in contact with an upper surface of the low refractive layer LRL. The first inorganic layer SBL1 may encapsulate or seal a bottom surface of the color controller CCP. The second inorganic layer SBL2 may be disposed between the optical sheet OF shown in FIG. 3 and a top surface of the color controller CCP to be in contact with a top surface of the color controller CCP. The second inorganic layer SBL2 may encapsulate or seal other surfaces of the color controller CCP, which are not encapsulated by the first inorganic layer SBL1.

In an embodiment, the color controller CCP may be interposed between the first and second inorganic layers SBL1 and SBL2, whose end portions are in contact with each other, and may be encapsulated or hermetically sealed by the first and second inorganic layers SBL1 and SBL2. Thus, the first and second inorganic layers SBL1 and SBL2 may be used to prevent external moisture and/or oxygen from entering into the color controller CCP.

In an embodiment, at least one of the first and second inorganic layers SBL1 and SBL2 may have a single-layered structure.

In the case where the barrier layer BL of a single-layered structure includes silicon nitride ($SiN_x$), the first inorganic layer SBL1 may have a thickness of 0.1 μm or thicker, and the second inorganic layer SBL2 may have a thickness of 0.3 μm or thicker.

In the case where the barrier layer BL of a single-layered structure includes silicon oxide ($SiO_x$), the thickness of the first inorganic layer SBL1 may be thicker than the thickness of the first inorganic layer SBL1 in the barrier layer BL including silicon nitride ($SiN_x$). For example, the thickness of the first inorganic layer SBL1 may be equal to or larger than 0.3 μm. Furthermore, the thickness of the second inorganic layer SBL2 may be equal to or larger than 0.3 μm.

In an embodiment, the thickness of the first inorganic layer SBL1 may be larger when the barrier layer BL includes silicon oxide ($SiO_x$) than when the barrier layer BL includes silicon nitride ($SiN_x$). In detail, in the case where the barrier layer BL including silicon oxide ($SiO_x$) is grown from the color controller CCP having an uneven profile, a boundary of a growth surface encapsulating the color controller CCP may be slowly formed as compared with the case of silicon nitride ($SiN_x$). Thus, to effectively prevent moisture and/or oxygen from entering into the color controller CCP, the thickness of the first inorganic layer SBL1 may be larger when the barrier layer BL includes silicon oxide ($SiO_x$) than when the barrier layer BL includes silicon nitride ($SiN_x$).

Referring to FIG. 4B, a barrier layer BL-B according to an embodiment of the inventive concept may include a first layer SBL1-1 and a second layer SBL2-1, each of which includes a plurality of layers. The first layer SBL1-1 may include a first sub-layer SL1-1 and a second sub-layer SL1-2. The second layer SBL2-1 may include a first sub-layer SL2-1 and a second sub-layer SL2-2.

In an embodiment, the first sub-layer SL1-1 may be formed of or include silicon oxide ($SiO_x$), and the second sub-layer SL1-2 may be formed of or include silicon nitride ($SiN_x$). The first sub-layer SL1-1 and the second sub-layer SL1-2 may be alternately arranged.

In an embodiment, the first sub-layer SL2-1 may be formed of or include silicon nitride ($SiN_x$), and the second sub-layer SL2-2 may be formed of or include silicon oxide ($SiO_x$). The first sub-layer SL2-1 and the second sub-layer SL2-2 may be alternately arranged.

Although FIG. 4B illustrates an example in which the first sub-layer SL1-1 or SL2-1 and the second sub-layer SL1-2 or SL2-1 has a single-layered structure, the inventive concept is not limited to this example. For example, a plurality of first sub-layers and a plurality of second sub-layers may be disposed in an alternate manner. In addition, a sub-layer in contact with the color controller CCP may contain silicon oxide ($SiO_x$), but the inventive concept is not limited to this example.

Figure 5:
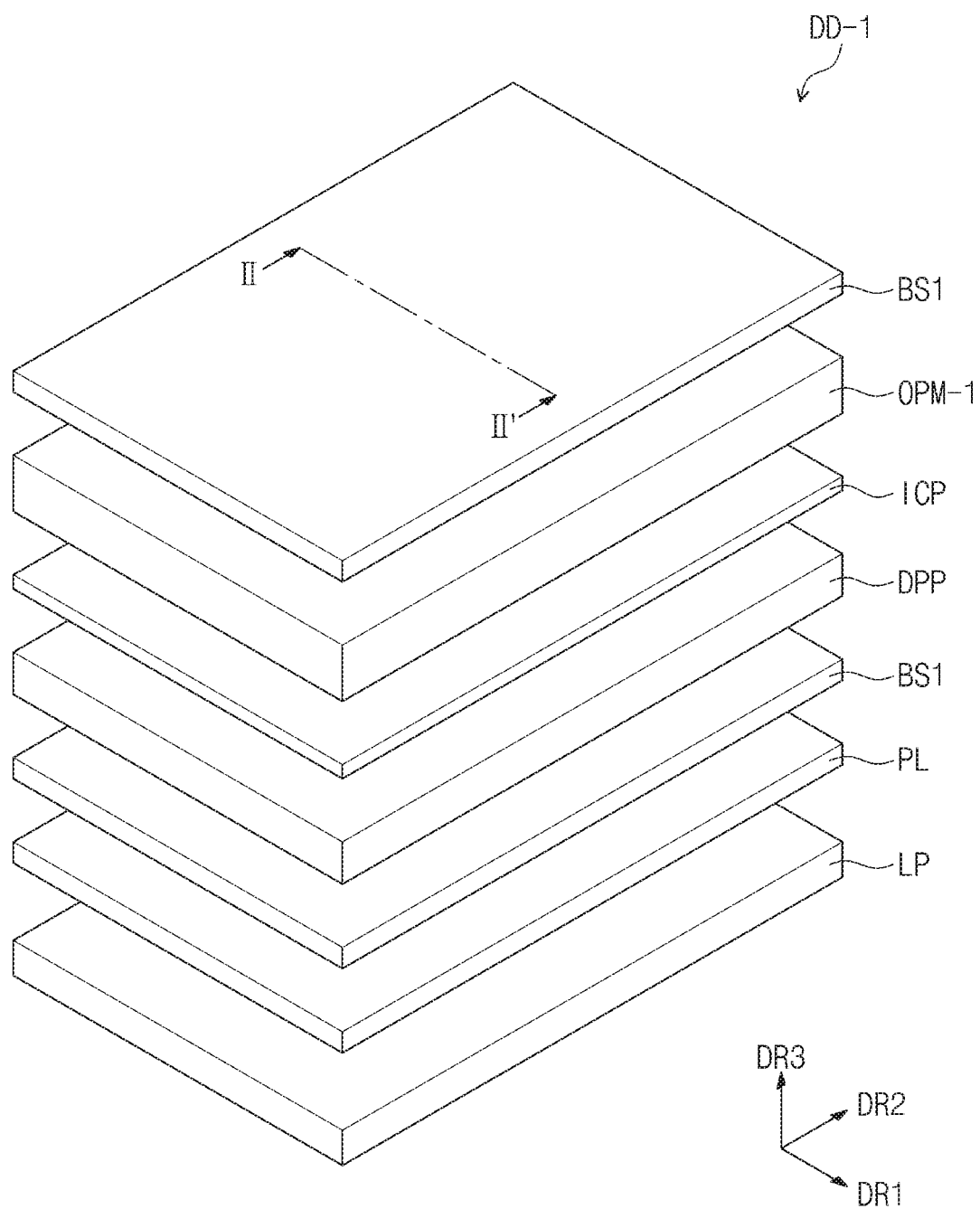
FIG. 5 is an exploded perspective view illustrating a display device according to an embodiment of the inventive concept.
Figure 6:
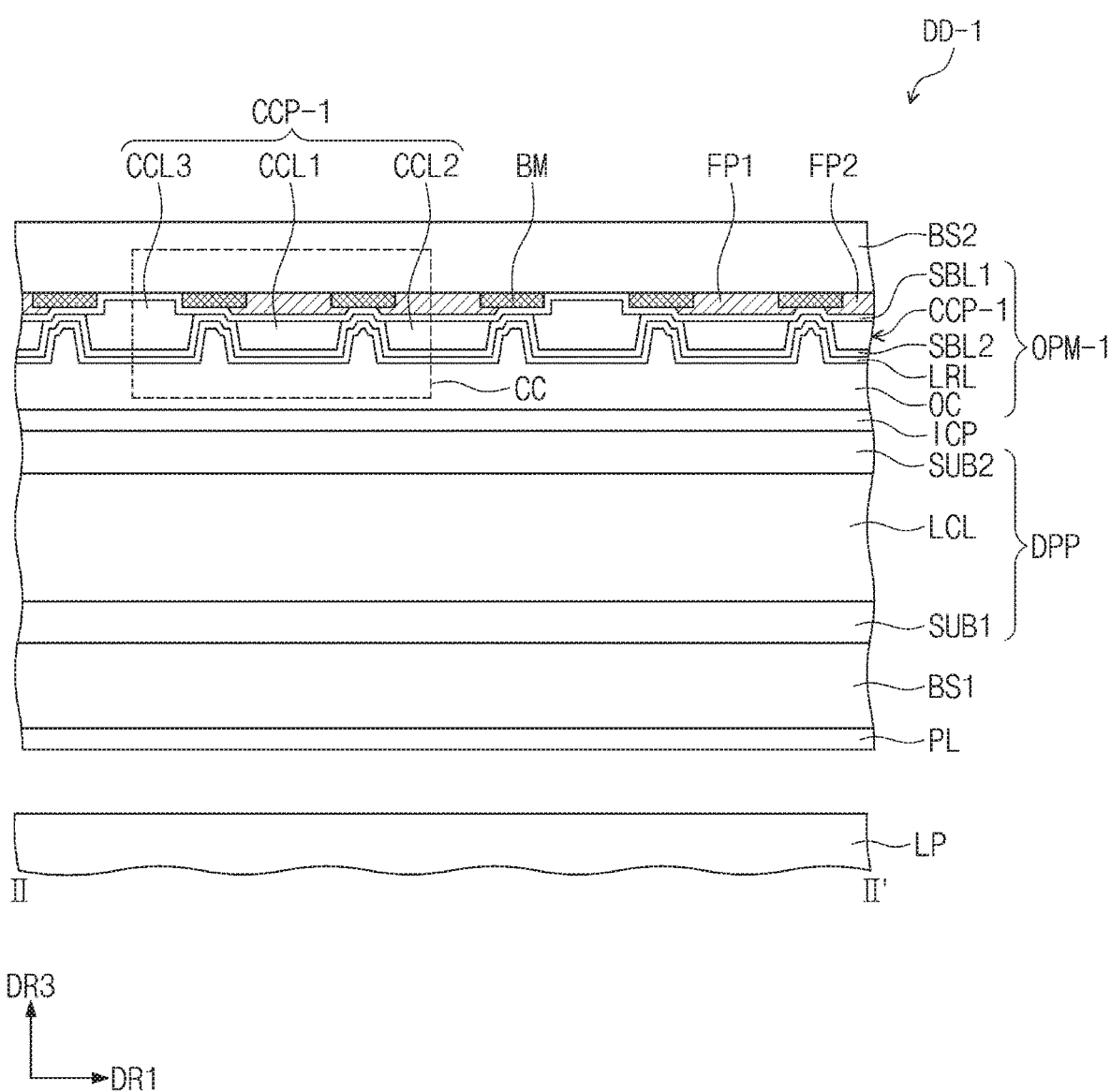
FIG. 6 is a sectional view illustrating a display device according to an embodiment of the inventive concept.
Figure 7:
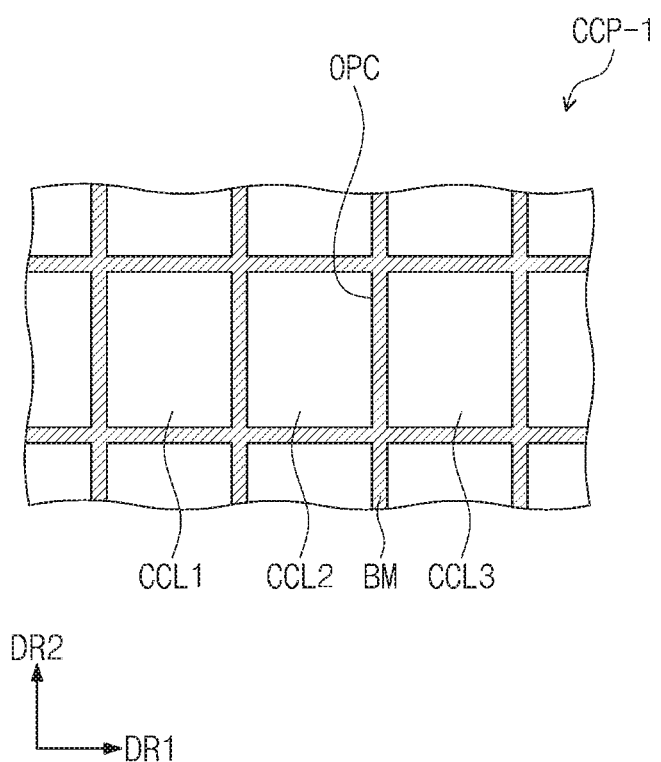
FIG. 7 is a plan view illustrating an optical modifier according to an embodiment of the inventive concept.
Figure 8:
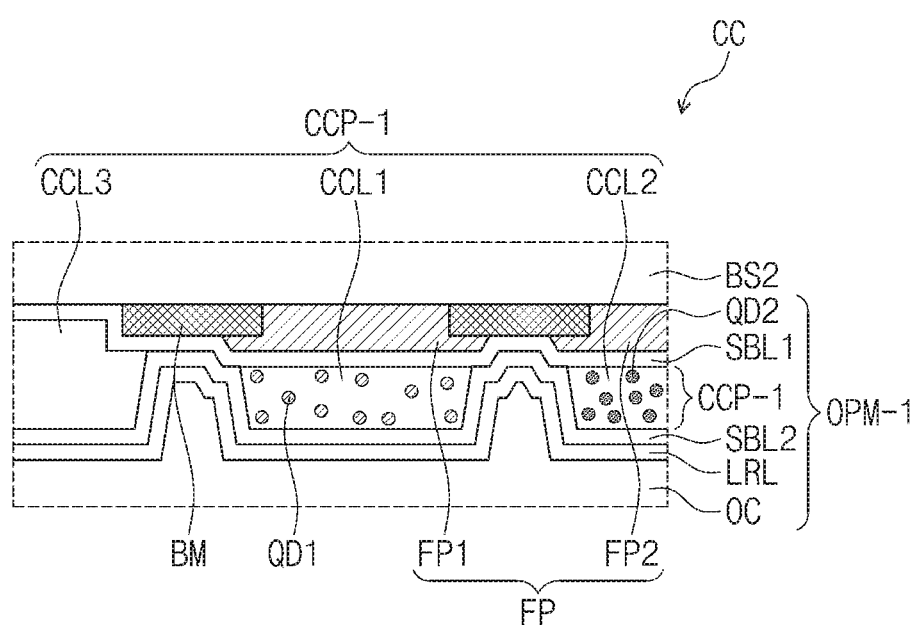
FIG. 8 is an enlarged view illustrating a CC region of FIG. 6.

FIG. 5 is an exploded perspective view illustrating a display device according to an embodiment of the inventive concept. FIG. 6 is a sectional view illustrating a display device according to an embodiment of the inventive concept. FIG. 7 is a plan view illustrating an optical modifier according to an embodiment of the inventive concept. FIG. 8 is an enlarged view illustrating a CC region of FIG. 6. For concise description, an element previously described with reference to FIGS. 1 to 3, 4A, and 4B may be identified by the same reference number without repeating an overlapping description thereof.

Referring to FIGS. 5 to 8, a display module DD-1 according to an embodiment of the inventive concept may include the backlight LP, the first base substrate BS1, the display portion DPP, an optical modifier OPM-1, the second base substrate BS2, a first polarization layer PL, and a second polarization layer ICP.

In an embodiment, the optical modifier OPM-1 may include a color controller CCP-1, a barrier layer SBL-1 and SBL-2, a low refractive layer LRL, and a planarization layer OC.

In an embodiment, the backlight LP, the first base substrate BS1, the display portion DPP, and the second base substrate BS2 of the display module DD-1 may be configured to have substantially the same features as the backlight LP, the first base substrate BS1, the display portion DPP, and the second base substrate BS2 described with reference to FIGS. 1 to 3.

In an embodiment, the display module DD-1 may include the first polarization layer PL and the second polarization layer ICP. The first polarization layer PL may be disposed between the backlight LP and the first base substrate BS1. The first polarization layer PL may be provided as a separate member or may include a polarizer formed by a coating or deposition method. The first polarization layer PL may be formed by coating a material containing a dichroic dye and a liquid crystal compound. In an embodiment, the first polarization layer PL may be a layer including a wire grid type polarizer.

The first polarization layer PL may be disposed on a bottom surface of the first base substrate BS1. However, the inventive concept is not limited to this example, and in an embodiment, the first polarization layer PL may be disposed on a top surface of the first base substrate BS1. Even in this case, the first polarization layer PL may be disposed between a liquid crystal layer LCL (e.g., see FIG. 3) of a display portion DDP and a first base substrate BS1.

The second polarization layer ICP may be disposed between the optical modifier OPM-1 and the display panel DP. The second polarization layer ICP may be an in-cell type polarization layer. The second polarization layer ICP may be formed by coating a material containing a dichroic dye and a liquid crystal compound. In an embodiment, the second polarization layer ICP may be a layer including a wire grid type polarizer.

In an embodiment, the color controller CCP-1 may be disposed between the second base substrate BS2 and the display portion DPP. The color controller CCP-1 may include a plurality of sub-color controllers CCL1, CCL2, and CCL3, which are spaced apart from each other when viewed in a plan view.

First to third sub-color controllers CCL1, CCL2, and CCL3 may be provided on the second base substrate BS2. The first to third sub-color controllers CCL1, CCL2, and CCL3 may be provided on a bottom surface of the second base substrate BS2.

In an embodiment, the color controller CCP-1 may include the first converter QD1 which absorbs a first light and converts the first light to a second light having a wavelength different from that of the first light and the second converter QD2 which absorbs the first light and converts the first light to a third light having a wavelength different from that of the first light. For example, the first light may be a blue light, the second light may be a green light, and the third light may be a red light.

The first converter QD1 and the second converter QD2 included in the color controller CCP-1 may be provided to have substantially the same features as the converters QD1 and QD2 included in the color controller CCP described with reference to FIG. 3. For example, the first converter QD1 may be a green quantum dot and the second converter QD2 may be a red quantum dot.

The color controller CCP-1 may include a first sub-color controller CCL1 including the first converter QD1, a second sub-color controller CCL2 including the second converter QD2, and a third sub-color controller CCL3 which does not include a converter and is transparent to the first light.

For example, the first converter QD1 may absorb the first light or a blue light and then may emit a green light, whereas the second converter QD2 may absorb the blue light or the first light and then may emit a red light. In other words, the first sub-color controller CCL1 may be a first light-emitting region emitting a green light, and the second sub-color controller CCL2 may be a second light-emitting region emitting a red light.

In addition, the third sub-color controller CCL3 may be a portion in which a converter is not included. The third sub-color controller CCL3 may be a portion which is configured to transmit the first light provided from the backlight LP. For example, the third sub-color controller CCL3 may be configured to transmit a blue light. The third sub-color controller CCL3 may be formed of a polymer resin. For example, the third sub-color controller CCL3 may be formed of or include at least one of acrylic resins, urethane resins, silicone resins, or epoxy resins. The third sub-color controller CCL3 may be formed of a transparent resin or a white resin The color controller CCP-1 may further include a light-blocking portion BM. As shown in FIG. 7, the light-blocking portion BM may be formed in a lattice configuration to define a plurality of openings OPC. The first to third sub-color controllers CCL1, CCL2, and CCL3 may be surrounded by the light-blocking portion BM when viewed in a plan view. For example, each of the first to third sub-color controllers CCL1, CCL2, and CCL3 may be disposed to be overlapped with a corresponding one of the openings OPC and may be surrounded by the light-blocking portion BM. Thus, the light-blocking portion BM may be disposed at a border between adjacent ones of the first to third sub-color controllers CCL1, CCL2, and CCL3.

At least a portion of the light-blocking portion BM may be partially overlapped with the first to third sub-color controllers CCL1, CCL2, and CCL3 adjacent thereto. In other words, when viewed in a plan view defined by the first direction DR1 and the second direction DR2, the light-blocking portion BM may be overlapped with at least a portion of the first to third sub-color controllers CCL1, CCL2, and CCL3 which are adjacent thereto in a thickness direction.

The light-blocking portion BM may be a black matrix. The light-blocking portion BM may be formed of or include an organic or inorganic light-blocking material which includes a black pigment or dye. The light-blocking portion BM may prevent a light leakage phenomenon.

The first to third sub-color controllers CCL1, CCL2, and CCL3 may be spaced apart from each other when viewed in a plan view defined by the first and second directions DR1 and DR2. The first to third sub-color controllers CCL1, CCL2, and CCL3 may be surrounded by the light-blocking portion BM and may be spaced apart from each other with the light-blocking portion BM interposed therebetween. For example, the first to third sub-color controllers CCL1, CCL2, and CCL3 may be arranged in such a way that sub-color controllers which emit lights of different colors are disposed to be spaced apart from each other in the first direction DR1 and sub-color controllers which emit lights of the same color are disposed to be spaced apart from each other in the second direction DR2.

FIG. 7 illustrates an example of the arrangement of the first to third sub-color controllers CCL1, CCL2, and CCL3, but the inventive concept is not limited to this example or a specific embodiment. In an embodiment, the first to third sub-color controllers CCL1, CCL2, and CCL3 may be provided to have different areas.

As shown in FIG. 8, the color controller CCP-1 may further include light filter layers FP1 and FP2, which are disposed on the first and second sub-color controllers CCL1 and CCL2.

Each of the light filter layers FP1 and FP2 may transmit a specific color of light and block lights of other colors. The light filter layers FP1 and FP2 may be disposed on the first and second sub-color controllers CCL1 and CCL2 to overlap the first and second sub-color controllers CCL1 and CCL2. The light filter layers FP1 and FP2 may prevent a first light from passing therethrough and may allow a second light or a third light to pass therethrough.

For example, the light filter layers FP1 and FP2 may block a blue light and may transmit a green light and a red light, respectively. The light filter layers FP1 and FP2 may be disposed on the first and second sub-color controllers CCL1 and CCL2. However, the inventive concept is not limited to this example, and in an embodiment, the light filter layers FP1 and FP2 may include a light filter layer (not shown) disposed on the third sub-color controller CCL3. The light filter layer may transmit only a blue light.

The light filter layers FP1 and FP2 may be composed of a single layer or may have a structure including a plurality of stacked layers. For example, the light filter layers FP1 and FP2 may be a single layer, in which a material absorbing a blue light is contained, or may be a multi-layered structure including a low refractive index insulating layer and a high refractive index insulating layer.

In addition, each of the light filter layers FP1 and FP2 may contain a pigment or dye which can block a light of a specific wavelength. For example, each of the light filter layers FP1 and FP2 may be a yellow color filter layer which absorbs and blocks a blue light.

The light filter layers FP1 and FP2 may include a first light filter layer FP1 disposed on the first sub-color controller CCL1 and a second light filter layer FP2 disposed on the second sub-color controller CCL2. The first light filter layer FP1 may be a filter layer which blocks a blue light and transmits a green light. In addition, the second light filter layer FP2 may be a filter layer which blocks a blue light and transmits a red light.

In an embodiment, the optical modifier OPM-1 may include the barrier layer. In an embodiment, the barrier layer may include the first inorganic layer SBL1 and the second inorganic layer SBL2. The first inorganic layer SBL1 may be disposed on the second base substrate BS2. The first inorganic layer SBL1 may cover the light-blocking portion BM and the light filter layers FP1 and FP2. The first inorganic layer SBL1 may cover a portion of the second base substrate BS2, which is exposed by the light-blocking portion BM and the light filter layers FP1 and FP2.

The second inorganic layer SBL2 may be disposed on the color controller CCP-1. The second inorganic layer SBL2 along with the first inorganic layer SBL1 may encapsulate or seal the first to third sub-color controllers CCL1, CCL2, and CCL3. In an embodiment, the first inorganic layer SBL1 and the second inorganic layer SBL2 overlapped with the light-blocking portion BM may be in contact with each other. Thus, each of the first to third sub-color controllers CCL1, CCL2, and CCL3 may be separately encapsulated or sealed by the first inorganic layer SBL1 and the second inorganic layer SBL2. Accordingly, the display module DD-1 may efficiently prevent moisture and/or oxygen from entering into the color controller CCP-1.

In an embodiment, the barrier layer SBL1 and SBL2 may be formed of or include the same material as the barrier layer BL described with reference to FIGS. 3 to 4B. For example, the barrier layer SBL1 and SBL2 may include silicon nitride ($SiN_x$) and/or silicon oxide ($SiO_x$). In addition, the barrier layer SBL1 and SBL2 may have a single-layered structure, and each of the first and second inorganic layers SBL1 and SBL2 may be composed of a plurality of layers. However, the inventive concept is not limited to this example.

The low refractive layer LRL may be disposed on the second inorganic layer SBL2. The low refractive layer LRL may cover the second inorganic layer SBL2. In the optical modifier OPM-1 according to an embodiment of the inventive concept, the low refractive layer LRL may be disposed below the color controller CCP-1 to change a propagation direction of light, which is emitted from the color controller CCP-1 toward the display portion DPP.

For example, the low refractive layer LRL may be disposed below the color controller CCP-1 to reflect light, which is emitted through the color controller CCP-1 toward the second base substrate BS2. For example, the low refractive layer LRL may be configured to have a light extraction function. Accordingly, the display module DD-1 may exhibit an improved optical efficiency.

The optical modifier OPM-1 may include a planarization layer OC. The planarization layer OC may be disposed to cover an uneven surface of the low refractive layer LRL covering the first to third sub-color controllers CCL1, CCL2, and CCL3. The planarization layer OC may provide a flat surface, because the uneven surface of the low refractive layer LRL is covered with the planarization layer OC. The planarization layer OC may be formed of or include an organic material.

Figure 9A:
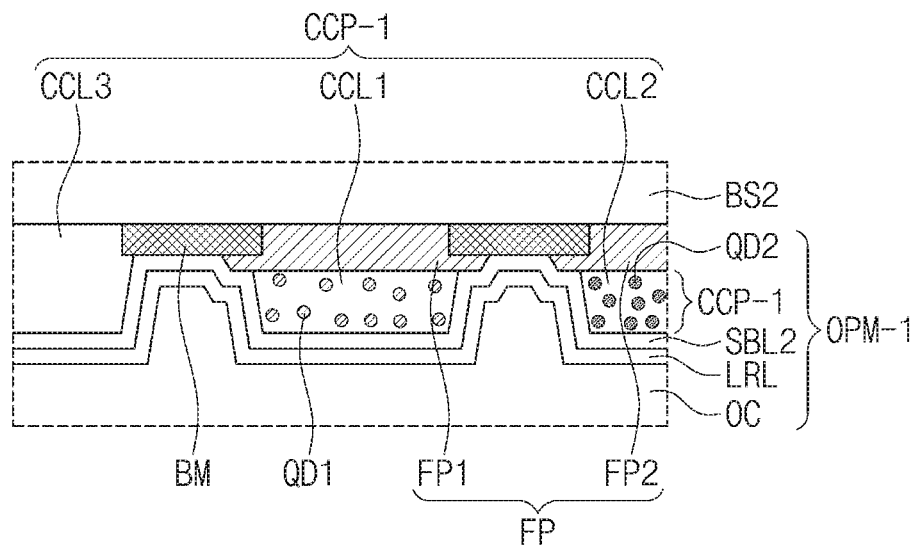
FIGS. 9A and 9B are enlarged views illustrating some elements of an optical modifier according to an embodiment of the inventive concept.
Figure 9B:
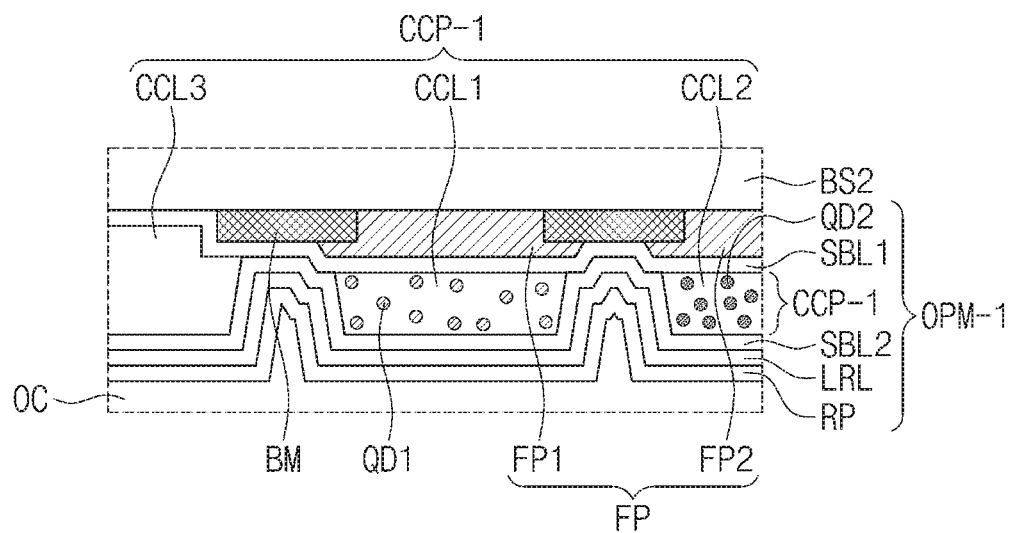

FIGS. 9A and 9B are enlarged views illustrating some elements of an optical modifier according to an embodiment of the inventive concept. FIGS. 9A and 9B illustrate some embodiments corresponding to the region CC of FIG. 8. For concise description, an element previously described with reference to FIG. 8 may be identified by the same reference number without repeating an overlapping description thereof.

Referring to FIG. 9A, the first inorganic layer SBL1 of FIG. 8 may be omitted. Thus, the second inorganic layer SBL2 may be disposed on the color controller CCP-1.

The second inorganic layer SBL2 along with the light-blocking portion BM and the light filter layers FP1 and FP2 may encapsulate or seal the first to third sub-color controllers CCL1, CCL2, and CCL3. For example, a portion of the second inorganic layer SBL2 overlapped with the light-blocking portion BM may be in direct contact with the light-blocking portion BM. Thus, each of the first to third sub-color controllers CCL1, CCL2, and CCL3 may be separately encapsulated or sealed by the second inorganic layer SBL2-1.

Referring to FIG. 9B, the optical modifier OPM-1 according to an embodiment of the inventive concept may further include a reflection layer RP. The reflection layer RP may be disposed between the color controller CCP-1 and the display panel DP. For example, the reflection layer RP may be spaced apart from the second inorganic layer SBL2 with the low refractive layer LRL interposed therebetween.

The reflection layer RP may be configured to have a selective transparent property to a first light emitted from the backlight LP. For example, the reflection layer RP may allow the first light to pass therethrough but may reflect a second light and a third light which are emitted from the first and second sub-color controllers CCL1 and CCL2 of the color controller CCP-1 toward the second base substrate BS2 to prevent the second light and the third light from being incident onto the display portion DPP. The reflection layer RP may be composed of a single layer or a plurality of stacked insulating layers.

For example, the reflection layer RP may include a plurality of insulating layers, and in this case, a wavelength range for transmittance and reflection in the reflection layer RP may be determined depending on a difference in refractive index between the stacked insulating layers, a thickness of each of the stacked insulating layers, and the number of the stacked insulating layers.

In an embodiment, the reflection layer RP may include a first insulating layer and a second insulating layer having different refractive indices. Each of the first insulating layer and the second insulating layer may be provided in plural. In an embodiment, the reflection layer RP may include a plurality of first and second insulating layers which are stacked in an alternate manner. In an embodiment, a metal oxide material may be used as an insulating layer of a relatively high refractive index. For example, a high refractive index insulating layer may include at least one of titanium oxide (TiOx), tantalum oxide (TaOx), hafnium oxide (HfOx), or zirconium oxide (ZrOx). In addition, an insulating layer of a relatively low refractive index may include silicon oxide (SiOx), silicon nitride (SiNx), and so forth. In an embodiment, the reflection layer RP may include silicon nitride layers and silicon oxide layers which are alternately and repeatedly stacked.

Although FIG. 9B illustrates an example of the reflection layer RP which is spaced apart from the second inorganic layer SBL2 with the low refractive layer LRL interposed therebetween, the inventive concept is not limited to this example. For example, the reflection layer RP may be disposed between the second inorganic layer SBL2 and the low refractive layer LRL.

Figure 10:
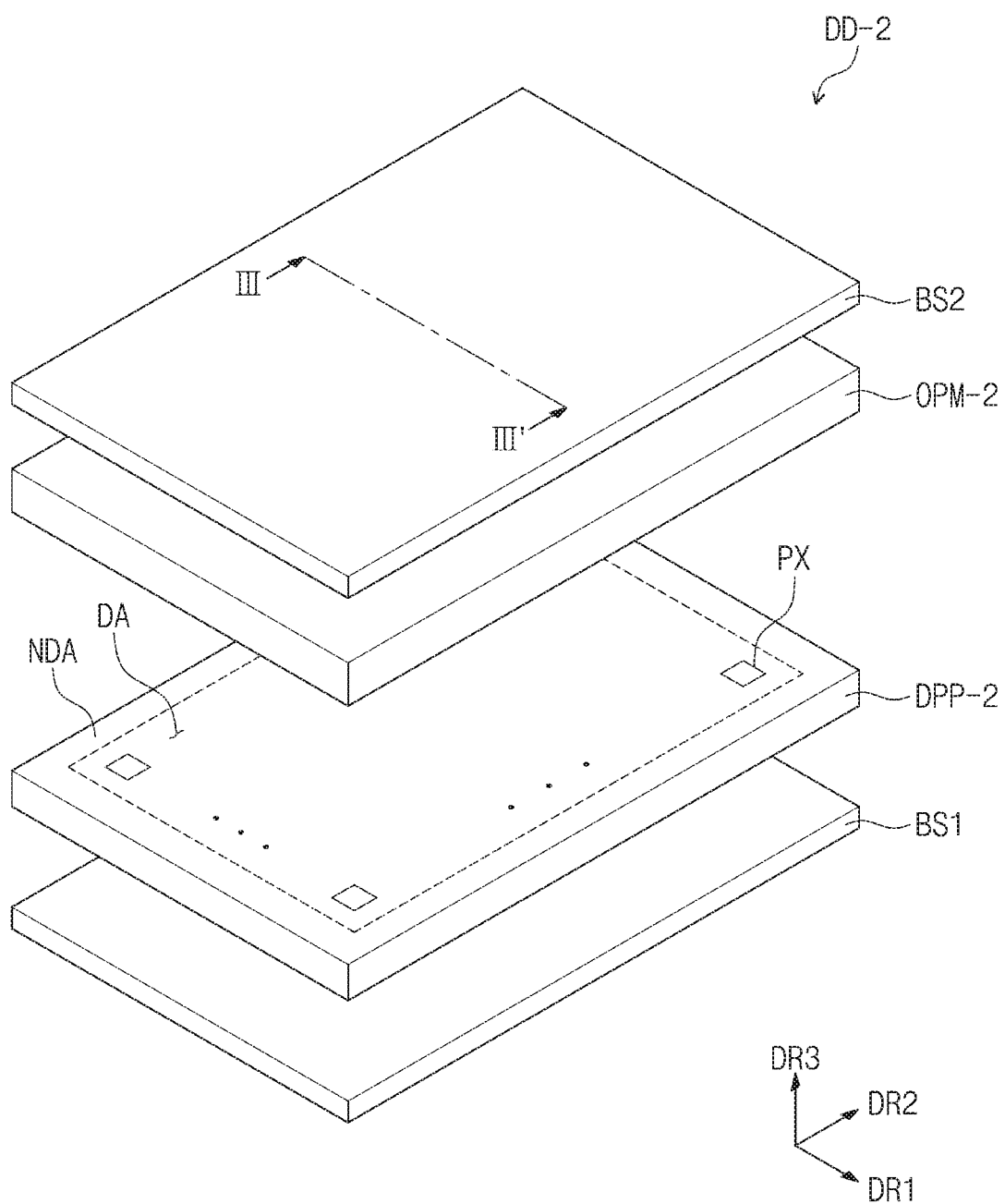
FIG. 10 is an exploded perspective view illustrating a display device according to an embodiment of the inventive concept.
Figure 11:
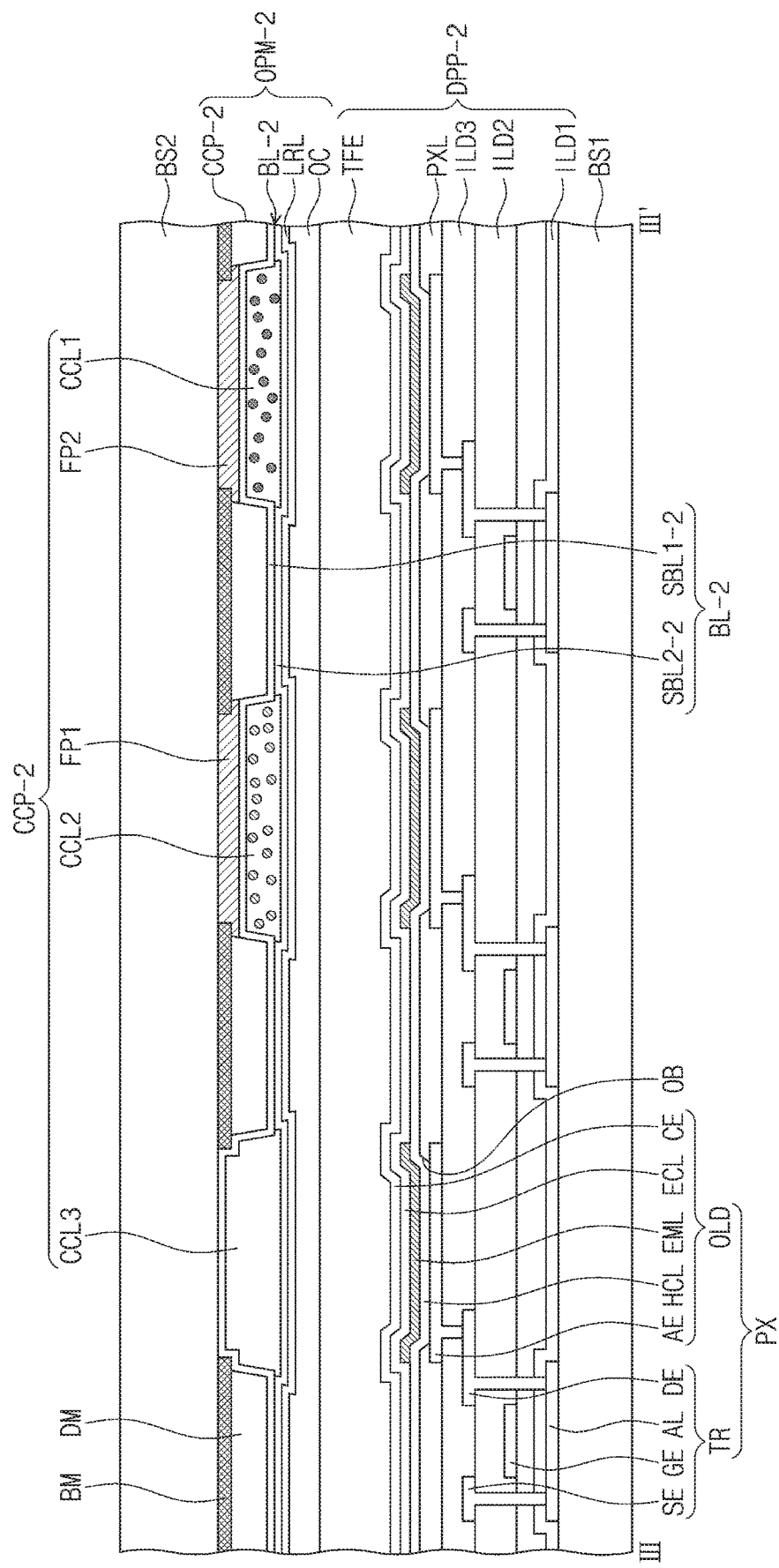
FIG. 11 is a sectional view illustrating a display device according to an embodiment of the inventive concept.

FIG. 10 is an exploded perspective view illustrating a display device according to an embodiment of the inventive concept. FIG. 11 is a sectional view illustrating a display device according to an embodiment of the inventive concept. For concise description, an element previously described with reference to FIGS. 1 to 3, 4A, and 4B may be identified by the same reference number without repeating an overlapping description thereof.

Referring to FIG. 10, a display module DD-2 according to an embodiment of the inventive concept may include the first base substrate BS1, a display portion DPP-2, an optical modifier OPM-2 and a second base substrate BS2.

In an embodiment, the optical modifier OPM-2 may include the low refractive layer LRL, a color controller CCP-2, and a barrier layer BL-2.

In an embodiment, the display portion DPP-2 may be a display panel including organic electroluminescence display elements. For example, the pixel PX in the display portion DPP-2 may include the transistor TR disposed on the first base substrate BS1 and an organic light emitting device OLD connected to the transistor TR The transistor TR may include a semiconductor pattern AL, the control electrode GE, the input electrode SE, and the output electrode DE.

The semiconductor pattern AL of the transistor TR and a first insulating layer ILD1 may be disposed on the first base substrate BS1. The first insulating layer ILD1 may cover the semiconductor pattern AL.

The control electrode GE and a second insulating layer ILD2 may be disposed on the first insulating layer ILD1. The second insulating layer ILD2 may cover the control electrode GE. Each of the first insulating layer ILD1 and the second insulating layer ILD2 may include an organic layer and/or an inorganic layer. Each of the first insulating layer ILD1 and the second insulating layer ILD2 may include a plurality of thin films.

The input electrode SE, the output electrode DE, and a third insulating layer ILD3 may be disposed on the second insulating layer ILD2. The third insulating layer ILD3 may cover the input and output electrodes SE and DE.

The input electrode SE and the output electrode DE may be connected to the semiconductor pattern AL, respectively, through contact holes defined in the first insulating layer ILD1 and the second insulating layer ILD2.

The organic light emitting device OLD and a pixel definition layer PXL may be disposed on the third insulating layer ILD3. The organic light emitting device OLD may include an anode electrode AE, a light emitting layer EML, a cathode electrode CE, a hole transport region HCL defined between the anode electrode AE and the light emitting layer EML, and an electron transport region ECL defined between the cathode electrode CE and the light emitting layer EML.

The anode electrode AE may be connected to the output electrode DE through a contact hole in the third insulating layer ILD3.

The pixel definition layer PXL may be disposed on the third insulating layer ILD3. An opening OB may be defined in the pixel definition layer PXL to expose at least a portion of the anode electrode AE. A region provided with the anode electrode AE may correspond to a light-emitting region of the organic light emitting device OLD. In an embodiment, a region, in which the opening OB is defined, may correspond to the light-emitting region.

The hole transport region HCL may be disposed on the anode electrode AE to cover the anode electrode AE and the pixel definition layer PXL. The hole transport region HCL may include at least one of a hole injection layer, a hole transport layer, or a single layer having both of a hole injection function and a hole transport function.

The light emitting layer EML may be disposed on the hole transport region HCL. In an embodiment, the light emitting layer EML may be defined as an organic layer containing an organic material.

The light emitting layer EML may be overlapped with the opening OB defined in the pixel definition layer PXL. For example, the light emitting layer EML may include a plurality of patterns, which are overlapped with the openings OB, respectively. The light emitting layer EML may be formed of or include at least one of fluorescent materials, phosphorescent materials, or quantum dots. The light emitting layer EML may generate mono-chromatic light or multi-chromatic light. In an embodiment, the light-emitting region may be overlapped with the light emitting layer EML when viewed in a plan view.

The electron transport region ECL may be disposed on the light emitting layer EML to cover the light emitting layer EML and the hole transport region HCL. The electron transport region ECL may include at least one of an electron transport material or an electron injection material. The electron transport region ECL may be an electron transport layer containing an electron transport material or a single electron injection/transport layer containing an electron transport material and an electron injection material.

The cathode electrode CE may be disposed on the electron transport region ECL to face the anode electrode AE. The cathode electrode CE may be formed of a material having a small work-function and hence may be used for easy injection of electrons.

An encapsulation layer TFE may be disposed on the cathode electrode CE. The encapsulation layer TFE may cover the entire top surface of the cathode electrode CE and may hermetically seal the organic light emitting device OLD. The encapsulation layer TFE may protect the organic light emitting device OLD from moisture and a contamination material. The encapsulation layer TFE may be formed by a deposition process.

The encapsulation layer TFE may include an inorganic layer and/or an organic layer. The inorganic layer may be formed of or include at least one of, for example, aluminum oxide (AlOx), silicon oxide (SiOx), silicon nitride (SiNx), silicon oxynitride (SiOxNy), silicon carbide (SiCx), titanium oxide (TiOx), zirconium oxide (ZrOx), or zinc oxide (ZnOx).

The organic layer may be formed of or include at least one of, for example, epoxy, polyimide (PI), polyethylene terephthalate (PET), polycarbonate (PC), polyethylene (PE), or polyacrylate. In an embodiment, the thin encapsulation layer TFE may include the plurality of inorganic layers which are spaced apart from each other with the organic layer interposed therebetween, and in this case, the organic layer may be covered with at least one of the inorganic layers.

In an embodiment, the color controller CCP-2 may be disposed on the second base substrate BS2. The color controller CCP-2 may include the light-blocking portion BM, the light filter layers FP1 and FP2, a barrier layer BL-2, and a dam portion DM.

The color controller CCP-2 may include the first to third sub-color controllers CCL1, CCL2, and CCL3. The first to third sub-color controllers CCL1, CCL2, and CCL3, the light filter layers FP1 and FP2, and the light-blocking portion BM may be provided to have substantially the same features as the first and third sub-color controllers CCL1, CCL2, and CCL3, the light filter layers FP1 and FP2, and the light-blocking portion BM which are included in the optical modifier OPM-1 described with reference to FIGS. 5 to 7.

In an embodiment, the first to third sub-color controllers CCL1, CCL2, and CCL3 may be disposed to be overlapped with the light emitting layer EML corresponding thereto. Thus, each of the sub-color controllers CCL1, CCL2, and CCL3 may be overlapped with the light-emitting region which is overlapped with the light emitting layer EML.

The dam portion DM may be disposed to be overlapped with the light-blocking portion BM. The dam portion DM may be disposed between respective ones of the first to third sub-color controllers CCL1, CCL2, and CCL3. The dam portion DM may be disposed such that it is not overlapped with the light-emitting region which is overlapped with the light emitting layer EML. Thus, each of the first to third sub-color controllers CCL1, CCL2, and CCL3 may be surrounded by the dam portion DM to be overlapped with the light-emitting region. The dam portion DM may be formed of a polymer resin. For example, the dam portion DM may be formed of or include at least one of acrylic resin or imide resin.

The light filter layers FP1 and FP2 may be disposed on the first and second sub-color controllers CCL1 and CCL2. The light filter layers FP1 and FP2 may prevent a first light from passing therethrough and may allow a second light or a third light to pass therethrough. In other words, the light filter layers FP1 and FP2 may block a blue light and may allow a green light and a red light to pass therethrough. However, the inventive concept is not limited to this example, and in an embodiment, the light filter layers FP1 and FP2 may include a light filter layer (not shown) disposed on the third sub-color controller CCL3. The light filter layer may allow only a blue light to pass therethrough.

In an embodiment, the barrier layer BL-2 may include a first inorganic layer SBL1-2 and a second inorganic layer SBL2-2. The first inorganic layer SBL1-2 may be disposed on the second base substrate BS2. The first inorganic layer SBL1-2 may cover the light-blocking portion BM, the light filter layers FP1 and FP2, and the dam portion DM. The first inorganic layer SBL1-2 may cover a portion of the second base substrate BS2 which is exposed by the light-blocking portion BM and the light filter layers FP1 and FP2.

The second inorganic layer SBL2-2 may be disposed on the color controller CCP-2. The second inorganic layer SBL2-2 along with the first inorganic layer SBL1-2 may encapsulate or seal the first to third sub-color controllers CCL1, CCL2, and CCL3. In an embodiment, the first inorganic layer SBL1-2 and the second inorganic layer SBL2-2 overlapped with the dam portion DM may be in contact with each other.

Thus, each of the first to third sub-color controllers CCL1, CCL2, and CCL3 may be separately encapsulated or hermetically sealed by the first inorganic layer SBL1-2 and the second inorganic layer SBL2-2. Accordingly, the display module DD-2 may efficiently prevent moisture and/or oxygen from entering into the color controller CCP-2.

In an embodiment, the barrier layer BL-2 may include the same material as the barrier layer BL described with respect to FIGS. 3 to 4B. For example, the barrier layer BL-2 may include silicon nitride ($SiN_x$) and/or silicon oxide ($SiO_x$). In addition, the barrier layer BL-2 may be composed of a single layer and each of the first and second inorganic layers SBL1-2 and SBL2-2 may be composed of a plurality of layers. However, the inventive concept is not limited to this example.

The low refractive layer LRL may be disposed on the second inorganic layer SBL2-2. The low refractive layer LRL may be disposed below the color controller CCP-2 to reflect light which is emitted from the color controller CCP-2 toward the second base substrate BS2. For example, the low refractive layer LRL may be configured to have a light extraction function.

The planarization layer OC may be disposed on the low refractive layer LRL. The planarization layer OC may be disposed to cover an uneven surface of the low refractive layer LRL covering the first to third sub-color controllers CCL1, CCL2, and CCL3. The planarization layer OC may provide a flat surface because the uneven surface of the low refractive layer LRL is covered with the planarization layer OC. The planarization layer OC may be formed of or include an organic material.

Although not shown, the optical modifier OPM-2 may further include a reflection layer disposed on the low refractive layer LRL. The reflection layer may have the same function as the reflection layer RP of FIG. 9B.

Figure 12A:
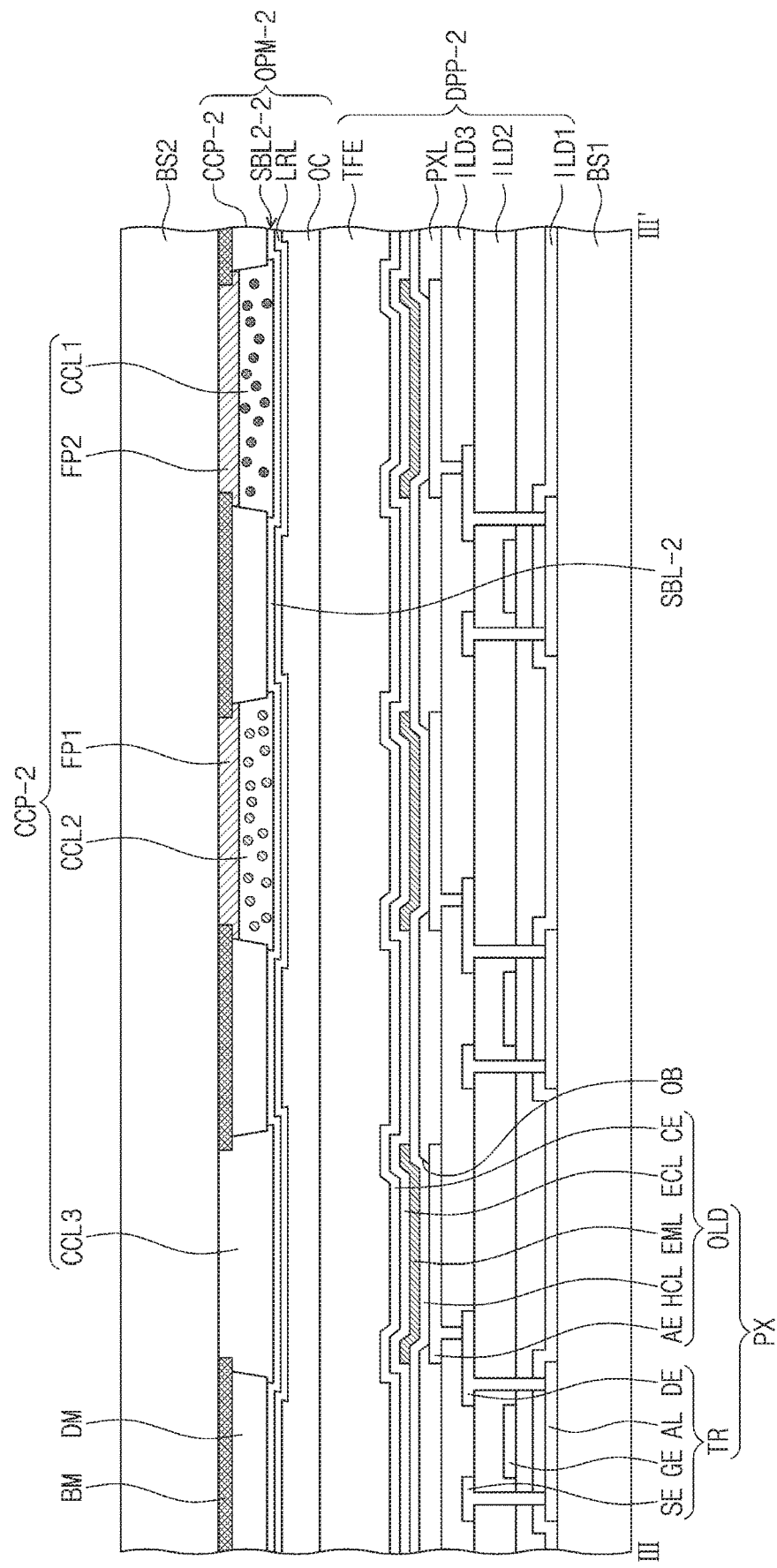
FIGS. 12A and 12B are sectional views illustrating a display device according to an embodiment of the inventive concept.
Figure 12B:
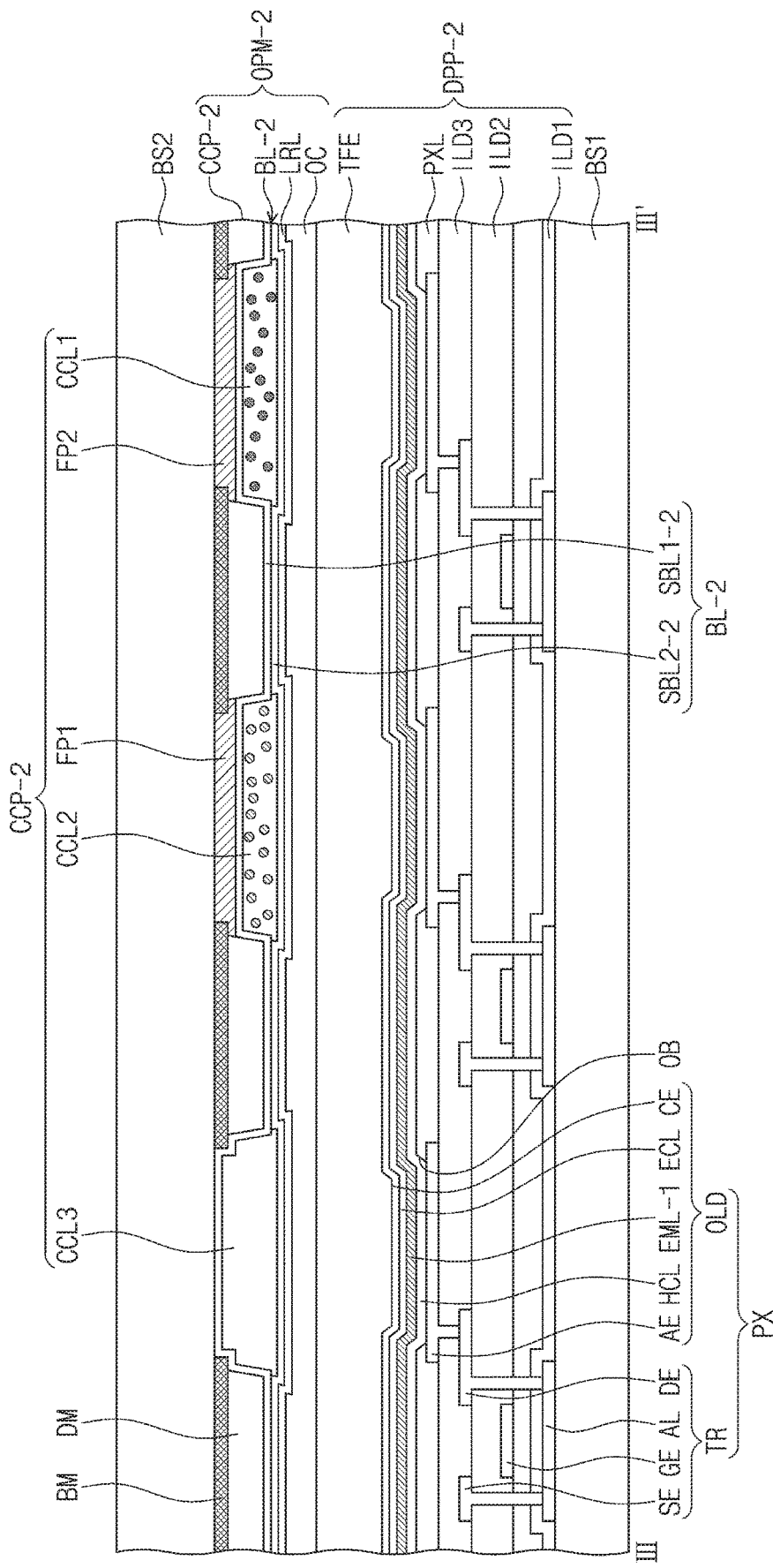

FIGS. 12A and 12B are sectional views illustrating a display device according to an embodiment of the inventive concept. For concise description, an element previously described with reference to FIGS. 1 to 3, 4A, and 4B may be identified by a similar or identical reference number without repeating an overlapping description thereof.

Referring to FIG. 12A, the first inorganic layer SBL1 of FIG. 8 may be omitted. Thus, the second inorganic layer SBL2-2 may be disposed on the color controller CCP-2.

The second inorganic layer SBL2-2, along with the light-blocking portion BM, the dam portion DM, and the light filter layers FP1 and FP2, may encapsulate or seal the first to third sub-color controllers CCL1, CCL2, and CCL3. For example, a portion of the second inorganic layer SBL2-2 overlapped with the dam portion DM may be in contact with the dam portion DM. Thus, each of the first to third sub-color controllers CCL1, CCL2, and CCL3 may be separately encapsulated or sealed by the second inorganic layer SBL2-2.

Referring to FIG. 12B, a light emitting layer EML-1 according to an embodiment of the inventive concept may be disposed as a common layer, unlike the light emitting layer EML of FIG. 11. For example, the light emitting layer EML-1 may be disposed to cover the entire top surface of the hole transport region HCL. In an embodiment, the light emitting layer EML-1 may be defined as an organic layer containing an organic material.

In an embodiment, a light, which is provided from the display portion DPP-2 to the optical modifier OPM-2, may be a blue light. Thus, the light generated from each of the pixels PX may have the same color, and in this case, the light emitting layer EML-1 may be disposed as a common layer which is formed without any patterning process on the hole transport region HCL.

According to the above embodiments described with reference to FIGS. 10 to 12B, the barrier layer BL-2 may be provided to encapsulate or hermetically seal the color controller CCP-2, and this may make it possible to improve a delamination issue which may occur when the barrier layer BL-2 is in contact with an inorganic layer (e.g., the low refractive layer LRL or the reflection layer RP).

According to an embodiment of the inventive concept, an inorganic layer may be provided to encapsulate a color controller. Here, the inorganic layer may have a layer density ranging from 1.50 g/cm3 to 3.0 g/cm3, and in this case, it is possible to prevent or suppress a delamination issue between a low refractive layer and a barrier layer from occurring in a display device.

While example embodiments of the inventive concept have been particularly shown and described, it will be understood by one of ordinary skill in the art that variations in form and detail may be made therein without departing from the spirit and scope of the attached claims.

What is claimed is:

1. An optical modifier, comprising:
a color controller including quantum dots;
a barrier layer disposed the color controller; and
a low refractive layer disposed on the color controller,
wherein at least one of the barrier layer and the low refractive layer directly contacts the color controller, and the barrier layer has a layer density ranging from 1.50 g/cm$^3$ to 3.0 g/cm$^3$.

2. The optical modifier of claim 1, wherein the barrier layer comprises silicon nitride (SiNX).

3. The optical modifier of claim 2, wherein a content ratio of nitrogen (N) to silicon (Si) in the barrier layer ranges from 0.70 to 1.50.

4. The optical modifier of claim 2, wherein a remaining stress of the barrier layer ranges from −300 MPa to 500 MPa.

5. The optical modifier of claim 1, wherein the barrier layer comprises silicon oxide (SiOX).

6. The optical modifier of claim 5, wherein a remaining stress of the barrier layer ranges from −500 MPa to 500 MPa.

7. The optical modifier of claim 1, wherein the barrier layer comprises:
a first inorganic layer covering a rear surface of the color controller; and
a second inorganic layer covering a top surface of the color controller.

8. The optical modifier of claim 7, wherein each of the first and second inorganic layers is composed of a single layer.

9. The optical modifier of claim 8, wherein the barrier layer comprises silicon nitride (SiNX),
a thickness of the first inorganic layer is larger than or equal to 0.1 μm, and
a thickness of the second inorganic layer is larger than or equal to 0.3 μm.

10. The optical modifier of claim 8, wherein the barrier layer comprises silicon oxide (SiOX),
a thickness of the first inorganic layer is larger than or equal to 0.3 μm, and
a thickness of the second inorganic layer is larger than or equal to 0.3 μm.

11. The optical modifier of claim 7, wherein at least one of the first and second inorganic layers comprises:
a first layer containing silicon nitride (SiNX); and
a second layer, which is stacked on the first layer and contains silicon oxide (SiOX).

12. The optical modifier of claim 11, wherein each of the first layer and the second layer is provided in plural, and
the first and second layers are disposed in an alternate manner.

13. A display device, comprising:
a base substrate;
a plurality of pixels disposed on the base substrate;
a color controller disposed on or below the pixels, the color controller including quantum dots;
a barrier layer disposed on the color controller; and
a low refractive layer disposed on the color controller,
wherein at least one of the barrier layer and the low refractive layer directly contacts the color controller, and the barrier layer has a layer density ranging from 1.50 g/cm$^3$ to 3.0 g/cm$^3$.

14. The display device of claim 13, wherein the barrier layer comprises:
a first inorganic layer covering a rear surface of the color controller; and
a second inorganic layer covering a top surface of the color controller.

15. The display device of claim 14, wherein the barrier layer comprises silicon nitride (SiNX), and
a content ratio of nitrogen (N) to silicon (Si) in the barrier layer ranges from 0.70 to 1.50.

16. The display device of claim 15, wherein a thickness of the first inorganic layer is larger than or equal to 0.1 μm, and
a thickness of the second inorganic layer is larger than or equal to 0.3 μm.

17. The display device of claim 14, wherein the barrier layer comprises silicon oxide (SiOX),
a thickness of the first inorganic layer is larger than or equal to 0.3 μm, and
a thickness of the second inorganic layer is larger than or equal to 0.3 μm.

18. The display device of claim 13, wherein each of the pixels comprises:
a transistor disposed on the base substrate;
a first electrode connected to the transistor;
a second electrode facing the first electrode; and
a liquid crystal layer disposed between the first electrode and the second electrode.

19. The display device of claim 18, further comprising:
a light source disposed below the base substrate to provide light; and
a light guide plate including an emission surface facing the base substrate, a bottom surface opposite to the emission surface, an incidence surface facing the light source and connecting the bottom surface to the emission surface, and an opposite surface opposite to the incidence surface,
wherein the light is a blue light.

20. The display device of claim 19, further comprising a first polarization layer and a second polarization layer, which are spaced apart from each other with the pixels interposed therebetween.

21. The display device of claim 19, wherein the color controller comprises sub-color controllers, each of which converts the light to light of different color.

22. The display device of claim 21, further comprising a light-blocking portion including a plurality of openings and a light filter layer overlapped with at least one of the openings,
  wherein at least one of the sub-color controllers is disposed to be overlapped with the light filter layer.

23. The display device of claim 13, wherein each of the pixels comprises:
  a transistor provided on the base substrate; and
  an organic light emitting device comprising a first electrode connected to the transistor, a second electrode spaced apart from the first electrode, and an organic layer disposed between the first electrode and the second electrode.

24. The display device of claim 23, wherein the color controller comprises sub-color controllers converting light, which is provided from the pixels, to light of different color.

25. The display device of claim 24, wherein the organic layer is disposed on an entire surface of the base substrate to provide a blue light to the color controller.

26. The display device of claim 23, wherein the organic layer comprises a plurality of patterns providing lights of different colors, and
  each of the plurality of patterns is overlapped with a corresponding one of the sub-color controllers.

27. The display device of claim 19, wherein the low refractive layer has a refractive index lower than that of the light guide plate.

28. The optical modifier of claim 1, wherein the barrier layer contacts directly low refractive layer.

29. The display device of claim 13, wherein the barrier layer contacts directly low refractive layer.

* * * * *